United States Patent
Cho

(10) Patent No.: US 10,789,021 B2
(45) Date of Patent: Sep. 29, 2020

(54) MEMORY DEVICE AND MEMORY SYSTEM

(71) Applicant: SAMSUNG ELECTRONICS CO., LTD., Suwon-si, Gyeonggi-do (KR)

(72) Inventor: Yong-Sung Cho, Hwaseong-si (KR)

(73) Assignee: Volentine, Whitt & Francos, PLLC, Suwon-si, Gyeonggi-do (KR)

( * ) Notice: Subject to any disclaimer, the term of this patent is extended or adjusted under 35 U.S.C. 154(b) by 395 days.

(21) Appl. No.: 15/379,122

(22) Filed: Dec. 14, 2016

(65) Prior Publication Data

US 2017/0242632 A1    Aug. 24, 2017

(30) Foreign Application Priority Data

Feb. 24, 2016    (KR) ........................ 10-2016-0022008

(51) Int. Cl.

| G06F 3/06 | (2006.01) |
| G06F 16/901 | (2019.01) |
| G11C 7/04 | (2006.01) |
| G06F 7/36 | (2006.01) |
| G11C 16/34 | (2006.01) |

(52) U.S. Cl.
CPC ............ *G06F 3/0688* (2013.01); *G06F 3/061* (2013.01); *G06F 3/0655* (2013.01); *G06F 7/36* (2013.01); *G06F 16/902* (2019.01); *G11C 7/04* (2013.01); *G11C 16/3459* (2013.01)

(58) Field of Classification Search
CPC ..... G11C 7/04; G11C 16/3459; G06F 3/0688; G06F 7/36
See application file for complete search history.

(56) References Cited

U.S. PATENT DOCUMENTS

| 6,073,204 A * | 6/2000 | Lakhani .............. G06F 12/0676 365/185.08 |
| 6,870,766 B2 | 3/2005 | Cho et al. |
| 7,590,007 B2 | 9/2009 | Futatsuyama |
| 7,768,836 B2 | 8/2010 | Li et al. |
| 8,111,556 B2 | 2/2012 | Wang et al. |
| 8,116,160 B2 | 2/2012 | Hwang |
| 8,274,836 B2 | 9/2012 | Harada et al. |
| 8,582,368 B2 | 11/2013 | Huh et al. |
| 8,611,157 B2 | 12/2013 | Dutta |
| 8,659,966 B2 | 2/2014 | Choi et al. |
| 2005/0288902 A1 * | 12/2005 | Coulson ................. G11C 11/22 702/186 |

(Continued)

FOREIGN PATENT DOCUMENTS

| JP | 2012027962 | 2/2012 |
| KR | 1020130005708 | 1/2013 |

*Primary Examiner* — Mark D Featherstone
*Assistant Examiner* — Kweku William Halm
(74) *Attorney, Agent, or Firm* — Volentine, Whitt & Francos, PLLC

(57) ABSTRACT

A memory device includes a memory cell array including a plurality of memory cells on which a programming loop is executed a plurality of times; a voltage generator configured to apply a verifying voltage to the memory cells, for verifying at least one programming state of the memory cells; and a voltage controller configured to control the voltage generator to change a level of the verifying voltage as a program loop count increases, based on temperature information about a temperature inside or outside the memory device.

25 Claims, 40 Drawing Sheets

| Program State | Control Parameter | Temp.1 | Temp.2(<Temp.1) | |
|---|---|---|---|---|
| P1 | Start Verify Voltage Level (SVL) | $V_{va1}$ | $V_{va1'}$ ($>V_{va1}$) | ... |
| | Level change degree (LCD) | $V_{cs1}$ | $V_{cs1'}$ ($>V_{cs1}$) | ... |
| | Start Loop(SL) | L | L | ... |
| P2 | Start Verify Voltage Level (SVL) | $V_{vb1}$ | $V_{vb1'}$ ($>V_{vb1}$) | ... |
| | Level change degree (LCD) | $V_{cs2}$ | $V_{cs2'}$ ($>V_{cs2}$) | ... |
| | Start Loop(SL) | M | M | ... |
| P3 | Start Verify Voltage Level (SVL) | $V_{vc1}$ | $V_{vc1'}$ ($>V_{vc1}$) | ... |
| | Level change degree (LCD) | $V_{cs3}$ | $V_{cs3'}$ ($>V_{cs3}$) | ... |
| | Start Loop(SL) | N | N | ... |

(56) References Cited

U.S. PATENT DOCUMENTS

| | | | | |
|---|---|---|---|---|
| 2008/0055998 A1* | 3/2008 | Jung | ............... | G11C 8/10 |
| | | | | 365/185.18 |
| 2008/0205139 A1* | 8/2008 | Futatsuyama | ....... | G11C 11/5628 |
| | | | | 365/185.03 |
| 2008/0253194 A1* | 10/2008 | Sim | ............... | G11C 16/3404 |
| | | | | 365/185.19 |
| 2009/0055577 A1* | 2/2009 | Moon | ............... | G11C 16/10 |
| | | | | 711/103 |
| 2009/0154244 A1* | 6/2009 | Shiga | ............... | G11C 8/08 |
| | | | | 365/185.11 |
| 2009/0190403 A1* | 7/2009 | Kwak | ............... | G11C 11/5635 |
| | | | | 365/185.11 |
| 2010/0219880 A1* | 9/2010 | Bae | ............... | H03K 5/082 |
| | | | | 327/513 |
| 2011/0080791 A1* | 4/2011 | Kim | ............... | G11C 11/5628 |
| | | | | 365/185.22 |
| 2011/0280067 A1* | 11/2011 | Kim | ............... | G11C 11/5628 |
| | | | | 365/185.2 |
| 2012/0020167 A1* | 1/2012 | Lee | ............... | G11C 16/0483 |
| | | | | 365/185.25 |
| 2013/0148434 A1* | 6/2013 | Komatsu | ............... | G11C 16/3459 |
| | | | | 365/185.22 |
| 2014/0269045 A1 | 9/2014 | Chu et al. | | |

* cited by examiner

FIG. 11A

| Program State | Control Parameter | |
|---|---|---|
| P1 | Start Verify Voltage Level (SVL) | $V_{va1}$ |
| | Level change degree (LCD) | $V_{os1}$ |
| | Start Loop(SL) | L |
| P2 | Start Verify Voltage Level (SVL) | $V_{vb1}$ |
| | Level change degree (LCD) | $V_{os2}$ |
| | Start Loop(SL) | M |
| P3 | Start Verify Voltage Level (SVL) | $V_{vc1}$ |
| | Level change degree (LCD) | $V_{os3}$ |
| | Start Loop(SL) | N |

FIG. 11B

| Program State | Control Parameter | | | | |
|---|---|---|---|---|---|
| P1 | Verify voltage Level(VVL) | $V_{va1}$ | $V_{va2}$ | $V_{va3}$ | .... |
| | Program Loop number(PLN) | L | L+1 | L+2 | .... |
| P2 | Verify voltage Level(VVL) | $V_{vb1}$ | $V_{vb2}$ | $V_{vb3}$ | .... |
| | Program Loop number(PLN) | M | M+1 | M+2 | .... |
| P3 | Verify voltage Level(VVL) | $V_{vc1}$ | $V_{vc2}$ | $V_{vc3}$ | .... |
| | Program Loop number(PLN) | N | N+1 | N+2 | .... |

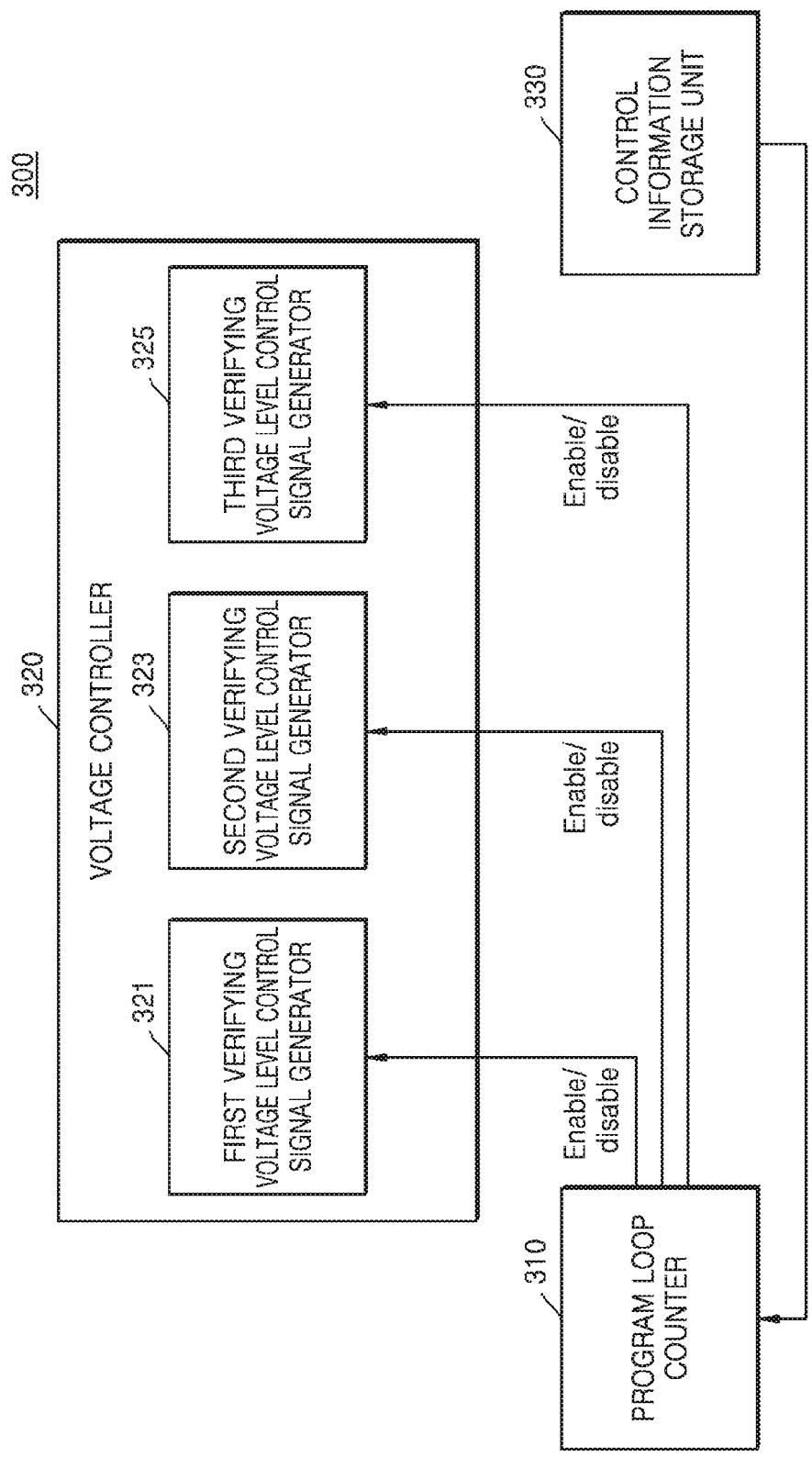

FIG. 18B

| Program State | Control Parameter | Temp.1 | Temp.2(<Temp.1) | |
|---|---|---|---|---|
| P1 | Start Verify Voltage Level (SVL) | $V_{va1}$ | $V_{va1'}$ ($>V_{va1}$) | ... |
| | Level change degree (LCD) | $V_{os1}$ | $V_{os1'}$ ($>V_{os1}$) | ... |
| | Start Loop(SL) | L | L | ... |
| P2 | Start Verify Voltage Level (SVL) | $V_{vb1}$ | $V_{vb1'}$ ($>V_{vb1}$) | ... |
| | Level change degree (LCD) | $V_{os2}$ | $V_{os2'}$ ($>V_{os2}$) | ... |
| | Start Loop(SL) | M | M | ... |
| P3 | Start Verify Voltage Level (SVL) | $V_{vc1}$ | $V_{vc1'}$ ($>V_{vc1}$) | ... |
| | Level change degree (LCD) | $V_{os3}$ | $V_{os3'}$ ($>V_{os3}$) | ... |
| | Start Loop(SL) | N | N | ... |

MEMORY DEVICE AND MEMORY SYSTEM

CROSS-REFERENCE TO RELATED APPLICATION

A claim for priority under 35 U.S.C. § 119 is made to Korean Patent Application No. 10-2016-0022008, filed on Feb. 24, 2016, in the Korean Intellectual Property Office, the disclosure of which is incorporated herein in its entirety by reference.

BACKGROUND

The inventive concept herein relates to a memory device, and more particularly, to a memory device and a memory system including a memory controller for controlling generation of a programming voltage and a verifying voltage.

Semiconductor memory devices may be classified into volatile memory devices such as dynamic random-access memories (DRAMs) and static RAMs (SRAMs) for example, and nonvolatile memory devices such as electrically erasable programmable read-only memories (EEPROMs), ferroelectric RAMs (FRAMs), phase-change RAMs (PRAMs), magnetoresistive RAMs (MRAMs), and flash memories for example. Volatile memory devices lose stored data when power is turned off, whereas nonvolatile memory devices preserve stored data even when power is turned off.

The availability and widespread use of electronic devices including nonvolatile memory devices have rapidly increased. For example, MP3 players, digital cameras, mobile phones, camcorders, flash cards, and solid-state disks (SSDs) typically include nonvolatile memory devices as storage devices. As the use and capabilities of electronic devices including nonvolatile memory devices as storage devices have increased, the storage capacity of nonvolatile memory devices has consequently increased. The storage capacity of a memory device may be increased by employing a multi-level cell (MLC) method in which a plurality of bits are stored in one memory cell. In order to recognize data stored in an MLC, a sufficient read margin must be secured. A general programming method which secures sufficient read margin may include a programming operation based on an incremental step pulse programming (ISPP) scheme in which programming states of memory cells are verified using a plurality of verifying voltages whenever a programming voltage pulse is applied to the memory cells. However, even after such a verifying operation is completed, the reliability of data stored in the memory cells is reduced due to memory cell characteristics.

SUMMARY

Embodiments of the inventive concept provide a memory device and a memory system including memory cells with improved reliability of stored data.

Embodiments of the inventive concept provide a memory device including a memory cell array including a plurality of memory cells on which a programming loop is executed a plurality of times; a voltage generator configured to apply a verifying voltage to each of the memory cells, for verifying at least one programming state of the memory cells; and a voltage controller configured to control the voltage generator to change a level of the verifying voltage as a program loop count increases, based on temperature information about a temperature inside or outside the memory device.

Embodiments of the inventive concept further provide a memory device including a memory cell array including a plurality of memory cells on which a programming loop is executed a plurality of times; a voltage generator configured to apply verifying voltages to the memory cell array, for verifying programming states of the memory cells; and a voltage controller configured to control the voltage generator so that levels of the verifying voltages gradually decrease as a program loop count increases.

Embodiments of the inventive concept also provide a memory system including a memory device including memory cells on which a programming loop is executed a plurality of times; and a memory controller configured to control the programming loop executed on the memory device. The memory device includes a voltage controller configured to control generation of verifying voltages having levels that are changed as a program loop count increases based on at least one of temperature information about a temperature inside or outside the memory device and programming states of the memory cells to be verified.

BRIEF DESCRIPTION OF THE DRAWINGS

Embodiments of the inventive concept will be more clearly understood from the following detailed description taken in conjunction with the accompanying drawings in which:

FIGS. 11A and 11B illustrate diagrams of control information needed during an operation of the voltage controller according to an embodiments of the inventive concept;

FIG. 15 illustrates a block diagram for explaining an operation of a program loop counter according to an embodiment of the inventive concept;

FIG. 18B illustrates a diagram of control information needed during an operation of the voltage controller according to another embodiment of the inventive concept;

DETAILED DESCRIPTION

The inventive concept will now be described more fully with reference to the accompanying drawings, in which various embodiments are shown.

As is traditional in the field of the inventive concept, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concept. Likewise, the blocks of the embodiments may be physically combined into more complex blocks without departing from the scope of the inventive concept.

Figure 1:
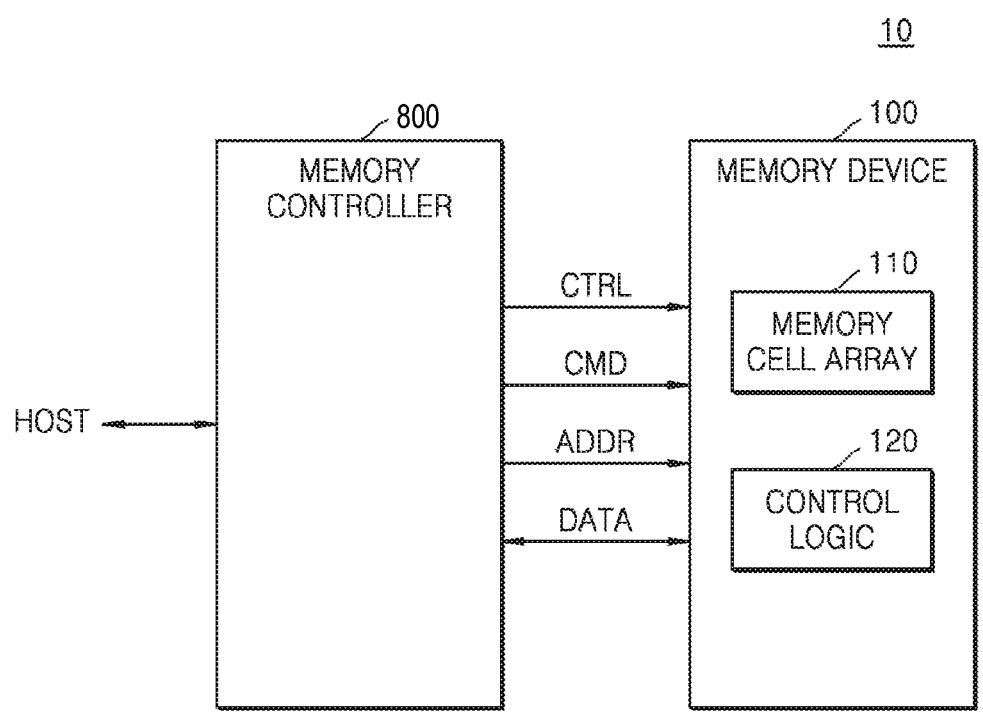
FIG. 1 illustrates a block diagram of a memory system according to an embodiment of the inventive concept.

FIG. 1 illustrates a block diagram of a memory system 10 according to an embodiment of the inventive concept.

Referring to FIG. 1, the memory system 10 includes a memory device 100 and a memory controller 800. The memory device 100 includes a memory cell array 110 and a control logic 120.

The memory cell array 110 may include a plurality of memory cells. The plurality of memory cells may be, for example, flash memory cells. It is assumed in the following description that the plurality of memory cells are NAND flash memory cells. However, the inventive concept is not limited thereto, and in other embodiments, the plurality of memory cells may for example be resistive memory cells such as resistive random-access memories (RRAMs), phase-change RAMs (PRAMs), or magnetic RAMs (MRAMs).

In an embodiment, the memory cell array 110 may be a three-dimensional (3D) memory array. The 3D memory array may be monolithically formed at one or more physical levels of memory cell arrays having an active area disposed over a silicon substrate and circuitry associated with operations of memory cells and formed over or in the silicon substrate. The term "monolithic" means that layers of each level of the array are directly stacked on layers of each underlying level of the array.

In an embodiment, the 3D memory array includes NAND strings that are vertically oriented so that at least one memory cell is located over another memory cell. The at least one memory cell may include a charge trap layer. Suitable configurations for 3D memory arrays in which 3D memory arrays are configured as a plurality of levels and word lines and/or bit lines are shared between the levels are disclosed in U.S. Pat. Nos. 7,679,133, 8,553,466, 8,654,587, and 8,559,235 and U.S. Patent Publication No. 2011-0233648, which are hereby incorporated by reference. Also, U.S. Patent Publication No. 2014-0334232 and U.S. Pat. No. 8,488,381 are hereby incorporated by reference.

In the present embodiment, the memory cell array 110 may include a plurality of NAND strings, and each of the NAND strings may include a ground selection transistor connected to a ground selection line, memory cells connected to word lines, and a string selection transistor connected to a string selection line, which are vertically stacked on a substrate. The NAND string may include more than one ground selection transistor, and/or more than one string selection transistor. In the present embodiment, the control logic 120 may control changing of a level of a verifying voltage when a programming loop including a programming operation and a verifying operation is executed on memory cells selected from among the memory cells included in the memory cell array 110. In an embodiment, the control logic 120 may gradually change levels of a plurality of verifying voltages based on at least one of a programming state of the memory cells to be verified and temperature information about a temperature inside or outside the memory device 100.

The memory controller 800 may control the memory device 100 to read data stored in the memory device 100 or write data to the memory device 100 in response to a read/write request from a host HOST. In detail, the memory controller 800 may control a programming (or write) operation, a read operation, and an erase operation to be performed on the memory device 100 by applying an address ADDR, a command CMD, and a control signal CTRL to the memory device 100. Also, data DATA for a programming operation and read data DATA may be transmitted/received between the memory controller 800 and the memory device 100.

Although not shown in FIG. 1, the memory controller 800 may include a RAM, a processing unit, a host interface, and a memory interface. The RAM may be used as a working memory of the processing unit, and the processing unit may control an operation of the memory controller 800. The host interface may include a protocol for performing data exchange between the host HOST and the memory controller 800. For example, the memory controller 800 may be configured to communicate with the host HOST through at least one of various interface protocols such as a universal serial bus (USB), multimedia card (MMC), peripheral component interconnect express (PCI-E), advanced technology attachment (ATA), serial-ATA, parallel-ATA, small computer system interface (SCSI), enhanced small disk interface (ESDI), and integrated drive electronics (IDE).

Figure 2:
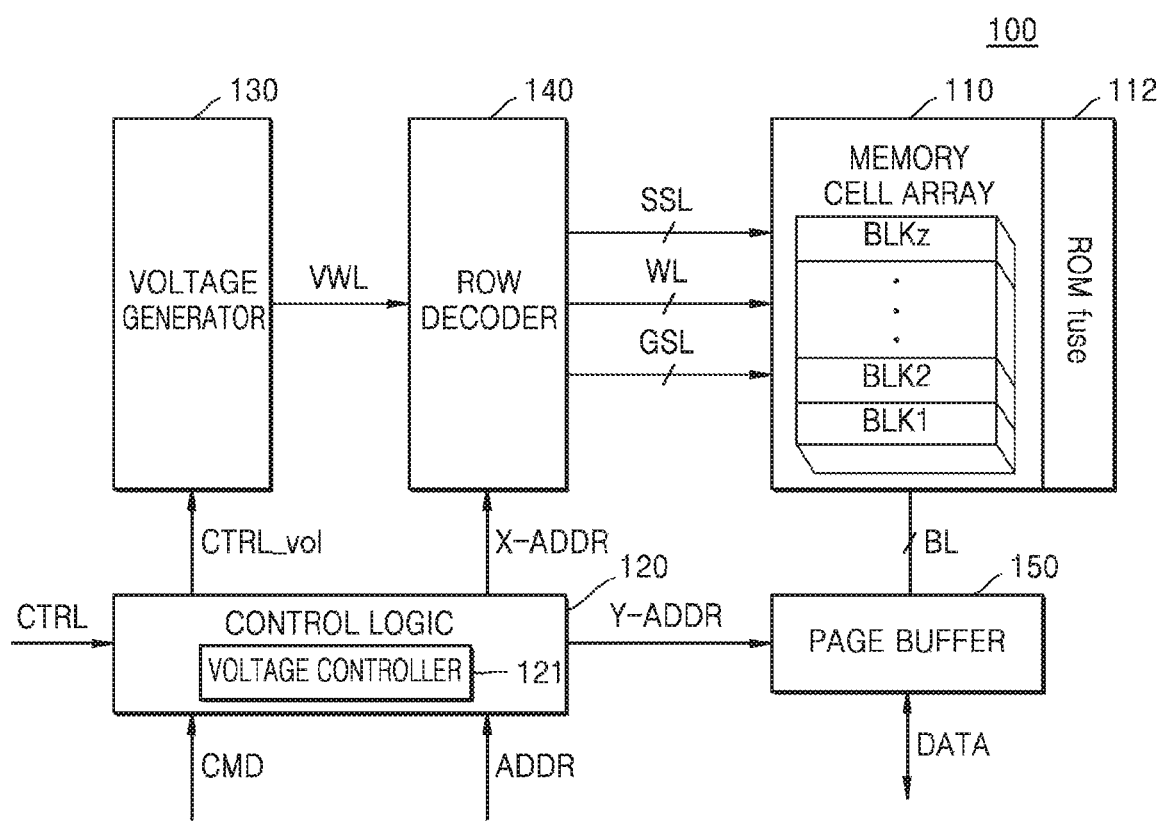
FIG. 2 illustrates a detailed block diagram of a memory device included in the memory system of FIG. 1.

FIG. 2 illustrates a detailed block diagram of the memory device 100 included in the memory system 10 of FIG. 1.

Referring to FIG. 2, the memory device 100 includes the memory cell array 110, a read-only memory (ROM) fuse 112, the control logic 120, a voltage generator 130, a row decoder 140, and a page buffer 150. Although not shown in FIG. 2, the memory device 100 may further include a data input/output circuit or an input/output interface.

The memory cell array 110 may include a plurality of memory cells, and may be connected to word lines WL, string selection lines SSL, ground selection lines GSL, and bit lines BL. In detail, the memory cell array 110 may be connected to the row decoder 140 through the word lines WL, the string selection lines SSL, and the ground selection lines GSL, and may be connected to the page buffer 150 through the bit lines BL.

The memory cell array 110 may include a plurality of blocks, e.g., first through $z^{th}$ blocks BLK1, BLK2 through BLKz, and each block may have a 3D structure (or a vertical structure). In detail, each block includes structures that extend in first through third directions. For example, each block includes a plurality of NAND strings (hereinafter, referred to as 'strings') that extend in the third direction. In this case, the plurality of strings may be spaced apart from one another in the first and second directions. One of the first through $z^{th}$ blocks BLK1 through BLKz may be selected by the row decoder 140. For example, the row decoder 140 may select a block corresponding to a block address from among the first through $z^{th}$ blocks BLK1 through BLKz.

The memory cell array 110 may include at least one of a single-level cell block including single-level cells, a multi-level cell block including multi-level cells, and a triple-level cell block including triple-level cells. In other words, some blocks from among the plurality of blocks included in the memory cell array 110 may be single-level cell blocks and other blocks may be multi-level cell blocks or triple-level cell blocks.

The ROM fuse 112 may include memory cells having the same structure as that of the memory cells of the memory cell array 110. Although the ROM fuse 112 is located adjacent to the memory cell array 110 in FIG. 2, the inventive concept is not limited thereto, and the ROM fuse 112 may be located far away from the memory cell array 110 or may be a part of the memory cell array 110. Pieces of information needed to generate a verifying voltage and a programming voltage generated to execute a programming loop on the memory cells may be stored in the ROM fuse 112. In an embodiment, the ROM fuse 112 may store control information including control parameters needed to gradually change a level of a verifying voltage as a programming loop is executed. In an embodiment, pieces of parameter information may include at least one of a change start verify voltage level parameter, a level change degree parameter, and a level change start loop parameter. In another embodiment, the pieces of parameter information may include at least one of a verifying voltage parameter and a program loop number parameter. A detailed explanation of the pieces of parameter information will be explained below.

The control logic 120 may output various control signals for writing data to the memory cell array 110 or reading data from the memory cell array 110 based on a command CMD, an address ADDR, and a control signal CTRL received from the memory controller 800. Accordingly, the control logic 120 may control overall various operations in the memory device 100.

The various control signals output from the control logic 120 may be applied to the voltage generator 130, the row decoder 140, and the page buffer 150. In detail, the control logic 120 may include a voltage controller 121. The voltage controller 121 may apply a voltage control signal CTRL_vol to the voltage generator 130. In an embodiment, the voltage controller 121 may generate the voltage control signal CTRL_vol for controlling generation of a verifying voltage and a programming voltage applied to the memory cell array 110 in order to write data to the memory cells.

In an embodiment, the voltage controller 121 may generate the voltage control signal CTRL_vol so that voltage levels of verifying voltages gradually decrease as a program loop count for the memory cells increases. Also, the voltage controller 121 may generate the voltage control signal CTRL_vol by referring to information that is stored in the ROM fuse 112. In another embodiment, the voltage controller 121 may generate the voltage control signal CTRL_vol so that verifying voltages for verifying programming states have different level change start timings. Also, the voltage controller 121 may generate the voltage control signal CTRL_vol so that verifying voltages have different level change degrees based on a programming state of memory cells to be verified. In an embodiment, the voltage controller 121 may generate the voltage control signal CTRL_vol so that the verifying voltages reach a level that is lower than reference voltage levels corresponding to verifying voltages. Also, the voltage controller 121 may generate the voltage control signal CTRL_vol so that a level of at least one verifying voltage from among verifying voltages is fixed after a programming loop is executed on the memory cells a predetermined number of times.

In another embodiment, the voltage controller 121 may generate the voltage control signal CTRL_vol so that levels of verifying voltages vary as a program loop count increases, based on temperature information about a temperature inside or outside the memory device 100. Also, the voltage controller 121 may generate the voltage control signal CTRL_vol to generate verifying voltages whereby at least one from among a level change degree and a change start verify voltage is changed, based on the temperature information. In another embodiment, the voltage controller 121 may generate the voltage control signal CTRL_vol in order to control generation of verifying voltages whose levels vary as a program loop count increases based on at least one of the temperature information and a programming state to be verified. Also, the voltage controller 121 may generate the voltage control signal CTRL_vol in order to control generation of verifying voltages whereby at least one from among a level change degree and a change start verify voltage is changed.

The voltage generator 130 may generate various voltages (indicated generally as VWL in FIG. 2) for performing programming, read, and erase operations on the memory cell array 110 based on the voltage control signal CTRL_vol. In detail, the voltage generator 130 may generate a word line voltage, for example, a programming voltage (or a write voltage), a read voltage, a programming inhibit voltage, a read inhibit voltage, or a verifying voltage. In an embodiment, the voltage generator 130 may generate a verifying voltage whose level varies as a program loop count increases based on the voltage control signal CTRL_vol. A programming loop may be executed by using an incremental step pulse programming (ISPP) scheme, and the voltage generator 130 may generate a programming voltage whose level increases by a step voltage from a previous programming voltage whenever a programming loop is executed.

The row decoder 140 may select some word lines from among the word lines WL in response to a row address X-ADDR received from the control logic 120. In detail, during a programming operation, the row decoder 140 may apply a programming voltage to the selected word lines and may apply a programming inhibit voltage to non-selected word lines. Also, the row decoder 140 may select some ground selection lines from among the ground selection lines GSL and some string selection lines from among the string selection lines SSL in response to the row address X-ADDR received from the control logic 120.

The page buffer 150 may be connected to the memory cell array 110 through the bit lines BL, and may select some bit lines from among the bit lines BL in response to a column address Y-ADDR received from the control logic 120. In detail, during a read operation, the page buffer 150 may operate as a sense amplifier and may detect data DATA stored in the memory cell array 110. During a programming operation, the page buffer 150 may operate as a write driver, and may input data DATA to be stored in the memory cell array 110.

Figure 3:
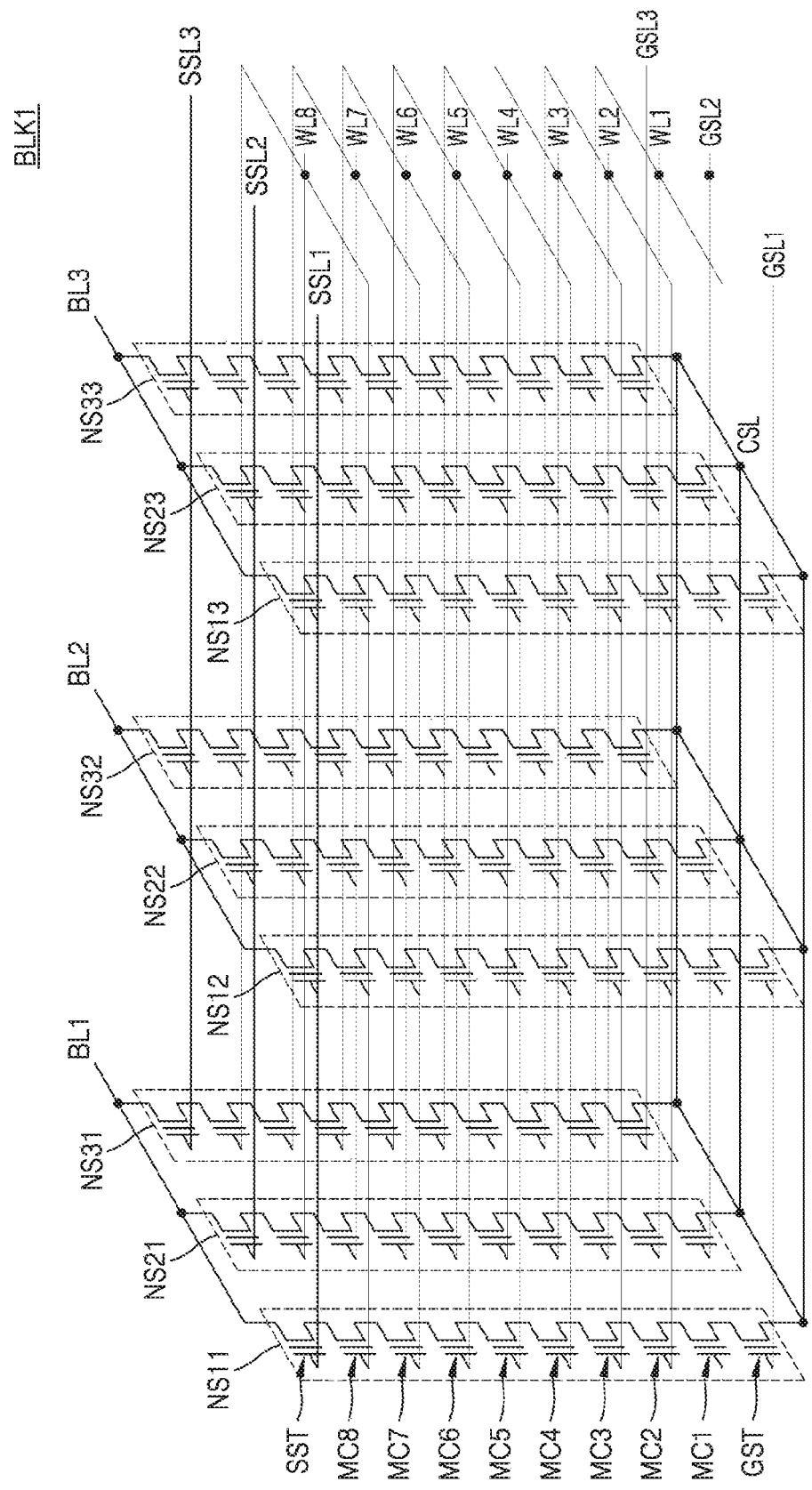
FIG. 3 illustrates a circuit diagram of an equivalent circuit of a first block of FIG. 2.

FIG. 3 illustrates a circuit diagram of an equivalent circuit of the first block BLK1 of FIG. 2.

Referring to FIG. 3, the first block BLK1 may be a vertical NAND flash memory, and each of the first through $z^{th}$ blocks BLK1 through BLKz of FIG. 2 may have the same form as that in FIG. 3. The first block BLK1 may include a plurality of NAND strings NS11 through NS33, a plurality of word lines WL1 through WL8, a plurality of bit lines, e.g., first through third bit lines BL1 through BL3, a plurality of ground selection lines GSL1 through GSL3, a plurality of string selection lines SSL1 through SSL3, and a common source line CSL. The number of NAND strings, the number of word lines, the number of bit lines, the number of ground selection lines, and the number of string selection lines may be changed in various ways.

The NAND strings NS11, NS21, and NS31 are provided between the first bit line BL1 and the common source line CSL, the NAND strings NS12, NS22, and NS32 are provided between the second bit line BL2 and the common source line CSL, and the NAND strings NS13, NS23, and NS33 are provided between the third bit line BL3 and the common source line CSL. Each NAND string (e.g., NS11) may include a string selection transistor SST, a plurality of memory cells MC1 through MC8, and a ground selection transistor GST that are serially connected. Hereinafter, a NAND string is referred to as a string for convenience of explanation.

Strings commonly connected to one bit line constitute one column. For example, the strings NS11, NS21, and NS31 commonly connected to the first bit line BL1 may correspond to a first column, the strings NS12, NS22, and NS32 commonly connected to the second bit line BL2 may correspond to a second column, and the strings NS13, NS23, and NS33 commonly connected to the third bit line BL3 may correspond to a third column.

Strings connected to one string selection line constitute one row. For example, the strings NS11, NS12, and NS13 connected to the first string selection line SSL1 may correspond to a first row, the strings NS21, NS22, and NS23 connected to the second string selection line SSL2 may correspond to a second row, and the strings NS31, NS32, and NS33 connected to the third string selection line SSL3 may correspond to a third row.

The string selection transistors SST are respectively connected to the string selection lines SSL1 through SSL3. The plurality of memory cells MC1 through MC8 are respectively connected to the word lines WL1 through WL8. The ground selection transistors GST are respectively connected to the ground selection lines GSL1 through GSL3. The string selection transistors SST are also respectively connected to the first through third bit lines BL1 through BL3, and the ground selection transistors GST are connected to the common source line CSL.

In the present embodiment, the word lines having the same height (e.g., WL1) are connected to one another, the string selection lines SSL1 through SSL3 are separated from one another, and the ground selection lines GSL1 through GSL3 are separated from one another. For example, when memory cells connected to the first word line WL1 and included in the strings NS11, NS12, and NS13 are programmed, the first word line WL1 and the first string selection line SSL1 are selected. However, the inventive concept is not limited thereto, and in another embodiment, the ground selection lines GSL1 through GSL3 may be connected to one another.

Figure 4:
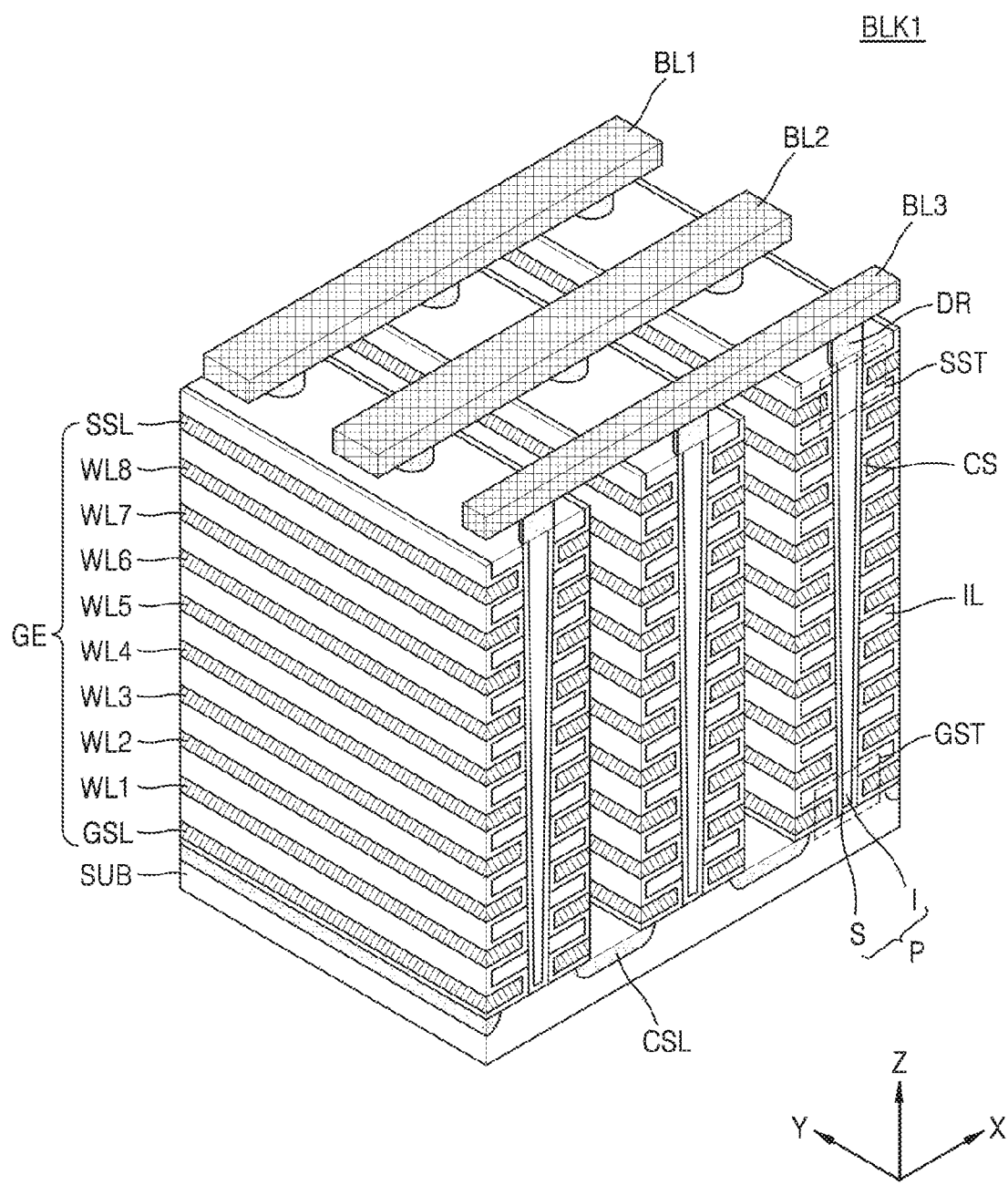
FIG. 4 illustrates a perspective view of the first block of FIG. 2 according to an embodiment of the inventive concept.

FIG. 4 illustrates a perspective view of the first block BLK1 of FIG. 2 according to an embodiment of the inventive concept.

Referring to FIG. 4, the first block BLK1 is formed in a direction perpendicular to a substrate SUB. Although the first block BLK1 includes two selection lines GSL and SSL, eight word lines WL1 through WL8, and three bit lines BL1 through BL3 in FIG. 4, the first block BLK1 may actually include fewer or more lines.

The substrate SUB has a first conductivity type (e.g., a p-type), and the common source line CSL extends in a first direction (e.g., a Y direction) on the substrate SUB and is doped with impurities having a second conductivity type (e.g., an n-type). A plurality of insulating films IL that extend in the first direction are sequentially provided in a third direction (e.g., a Z direction) on a portion of the substrate SUB between two adjacent common source lines CSL, and are spaced apart by a predetermined distance from each other in the third direction. For example, the plurality of insulating films IL may include an insulating material such as silicon oxide.

A plurality of pillars P that pass through the plurality of insulating films IL in the third direction and are sequentially arranged in the first direction are provided on a portion of the substrate SUB between two adjacent common source lines CSL. For example, the plurality of pillars P may pass through the plurality of insulating films IL and may contact the substrate SUB. In detail, a surface layer S of each of the pillars P may include a silicon material having a first conductivity type and may function as a channel region. An inner layer I of each pillar P may include an insulating material such as silicon oxide or an air gap.

A charge storage layer CS is provided along exposed surfaces of the insulating films IL, the pillars P, and the substrate SUB in a portion between two adjacent common source lines CSL. The charge storage layer CS may include a gate insulating layer (or referred to as a 'tunneling insulating layer'), a charge trap layer, and a blocking insulating layer. For example, the charge storage layer CS may have an oxide-nitride-oxide (ONO) structure. Also, a gate electrode GE such as each of the selection lines GSL and SSL and the word lines WL1 through WL8 is provided on an exposed surface of the charge storage layer CS in a portion between two adjacent common source lines CSL. A ground selection transistor GST is adjacent the substrate SUB.

Drains or drain contacts DR are provided on the plurality of pillars P. For example, the drains or drain contacts DR may include a silicon material doped with impurities having a second conductivity type. A string selection transistor SST is adjacent the drain contact DR. The first through third bit lines BL1 through BL3 that extend in a second direction (e.g., an X direction) and are spaced apart by a predetermined distance from each other in the first direction are provided on the drain or drain contacts DR.

According to the present embodiment, charges trapped in a predetermined region of the charge storage layer CS as a result of a programming operation may escape from the predetermined region and may be trapped in another region or may move to another layer other than the charge storage layer CS, thereby widening a threshold voltage distribution of memory cells. Accordingly, the reliability of a memory device including the charge storage layer CS may be reduced, which will be explained in detail below.

Figure 5:
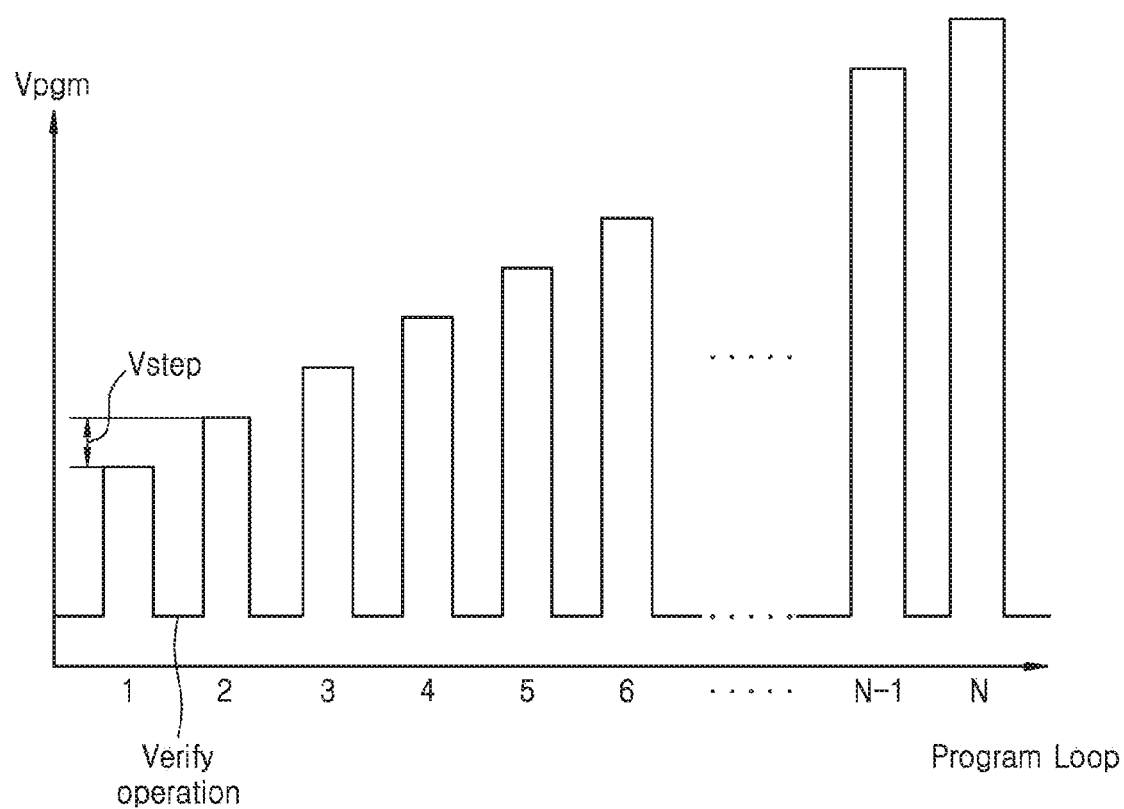
FIG. 5 illustrates a graph of a programming voltage applied to a memory cell during a programming operation according to an embodiment of the inventive concept.
Figure 6:
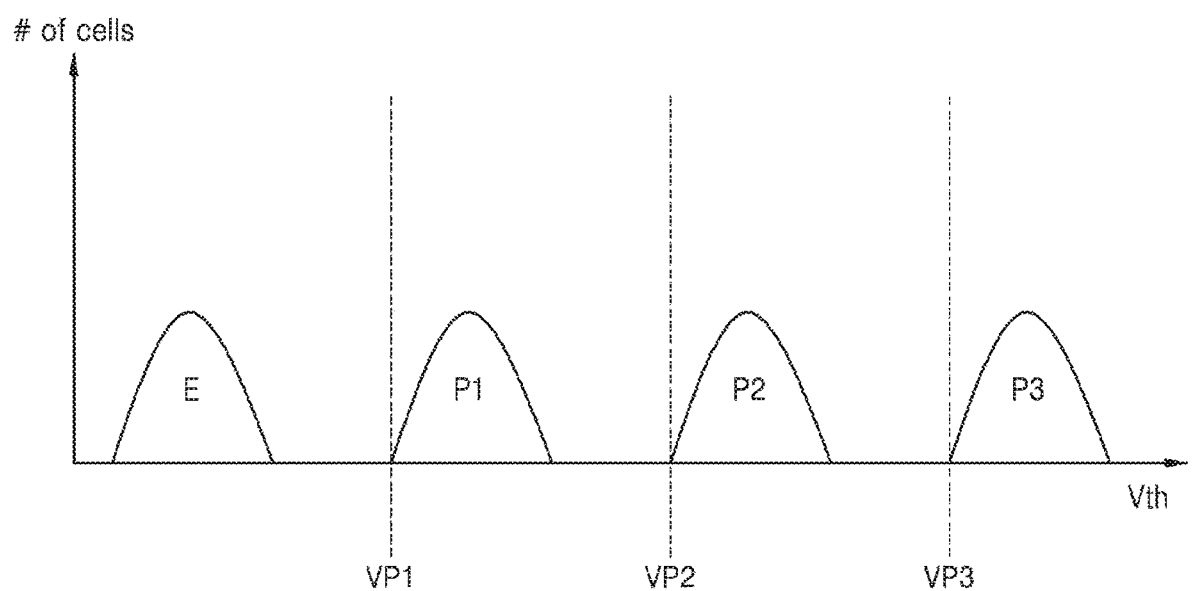
FIG. 6 illustrates a graph of a threshold voltage distribution of memory cells after a programming operation is completed.

FIG. 6 illustrates a graph of a programming voltage applied to a memory cell during a programming operation according to an embodiment of the inventive concept. In FIG. 5, the vertical axis represents a programming voltage Vpgm, and the horizontal axis represents a program loop number.

Referring to FIGS. 2 and 5, the voltage generator 130 may apply a programming voltage Vpgm operation to a selected word line of the memory cell array 110. A level of the programming voltage Vpgm increases by a step voltage Vstep whenever a programming loop is executed during a programming. Also, the voltage generator 130 may apply a verifying voltage to the selected word line of the memory cell array 110 in order to perform a verifying operation for verifying a programming state after a programming voltage Vpgm is applied.

FIG. 6 illustrates a graph of a threshold voltage distribution of memory cells after a programming operation is completed. In FIG. 6, the vertical axis represents a number of programmed memory cells, and the horizontal axis represents a threshold voltage.

Referring to FIG. 6, each memory cell according to an embodiment may be a multi-bit cell, and thus two or more bits of data may be stored in one memory cell. A threshold voltage distribution of memory cells having four programming states may be formed as shown in FIG. 6 by performing a programming operation by using an ISPP scheme of FIG. 5. Each memory cell may have an erase state E, a first programming state P1, a second programming state P2, or a third programming state P3 as a result of the programming operation. The voltage generator 130 of FIG. 2 may perform a verifying operation for verifying whether memory cells are in the first programming state P1 as a result of the programming operation by using a first verifying voltage VP1. Also, the voltage generator 130 may perform a verifying operation for verifying whether the memory cells are in the second programming state P2 by using a second verifying voltage VP2. The voltage generator 130 may perform a verifying operation for verifying whether the memory cells are in the third programming state P3 by using a third verifying voltage VP3. Although a memory device including memory cells in which two bits of data is stored is described, the inventive concept is not limited thereto. Thus, in an embodiment, a memory device including multi-level cells MLCs in which a plurality of bits of data may be stored and that may have a plurality of programming states may be used.

Figure 7A:
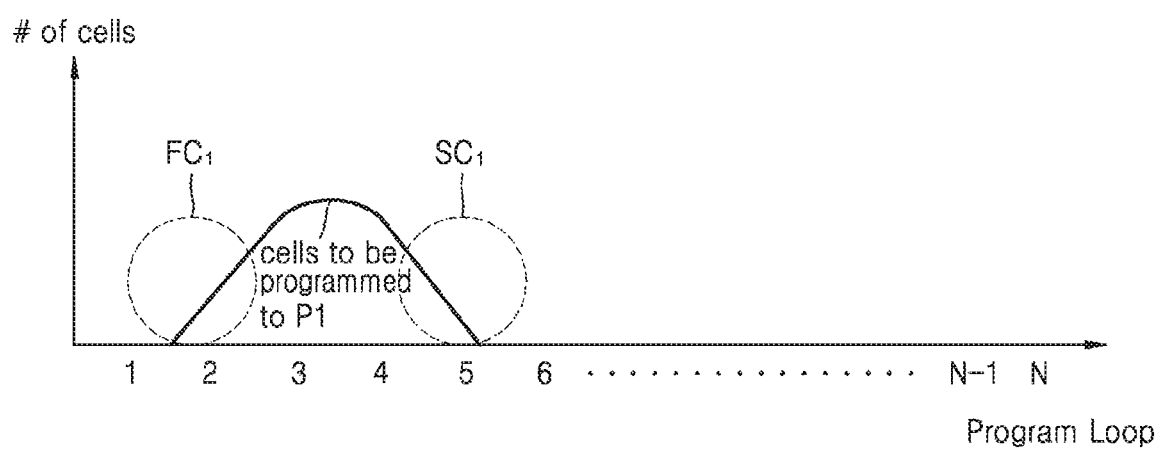
FIGS. 7A, 7B and 7C each illustrate a distribution graph of a program loop count needed until each programming state is formed when a pulse-type programming voltage is applied to memory cells.
Figure 7B:
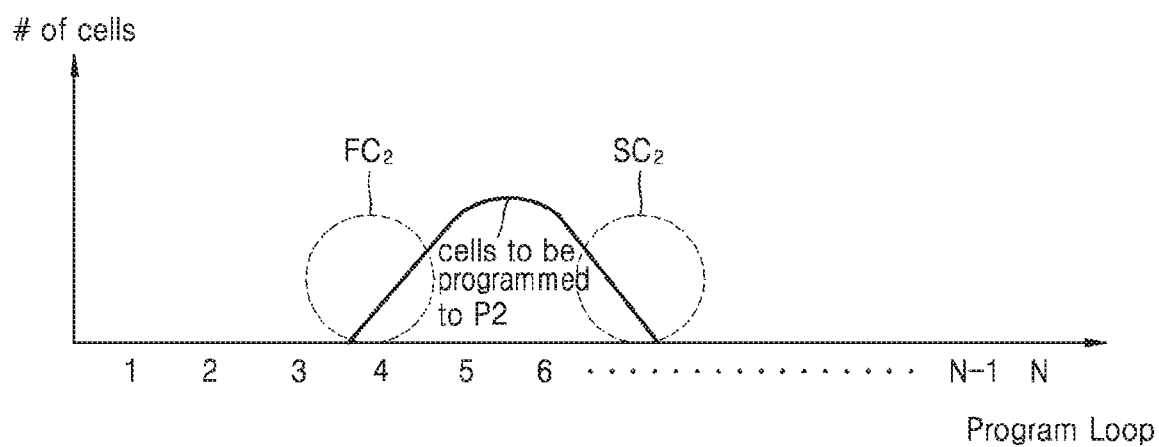
Figure 7C:
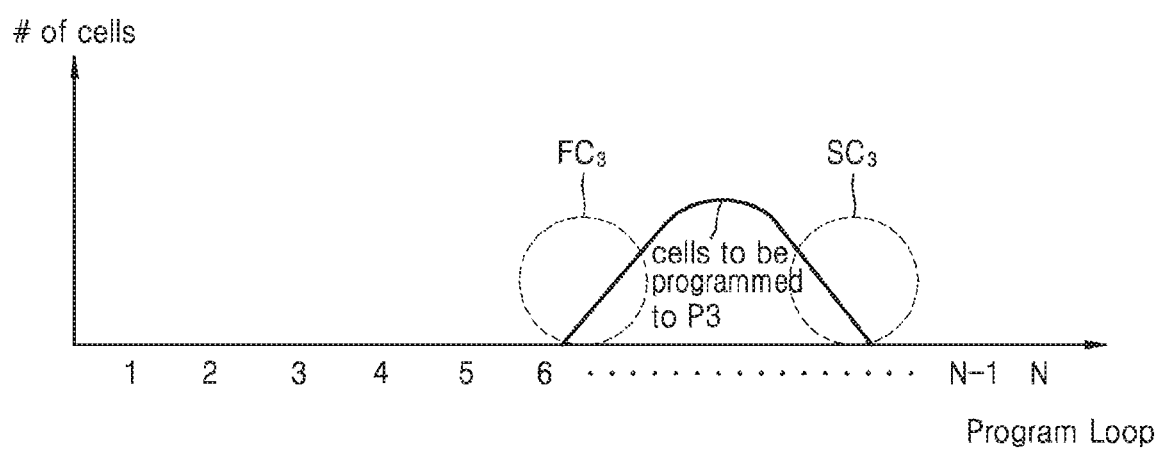

FIGS. 7A, 7B and 7C each illustrate a distribution graph of a program loop count needed until each programming state is reached when a pulse-type programming voltage is applied to memory cells. In FIGS. 7A-7C, the vertical axes represent a number of programmed memory cells, and the horizontal axes represent a program loop number.

Referring to FIG. 7A, a number of times a programming loop is repeatedly executed until a threshold voltage of a predetermined memory cell exceeds the first verifying voltage VP1 of FIG. 6 and the predetermined memory cell reaches the first programming state P1 may vary according to memory cells. That is, fast cells $FC_1$ may reach the first programming state P1 after a programming loop is executed thereon a relatively small number of times. Slow cells $SC_1$ may reach the first programming state P1 after a programming loop is executed thereon a relatively large number of times.

Referring to FIG. 7B, the number of times a programming loop is repeatedly executed until a threshold voltage of a predetermined memory cell exceeds the second verifying voltage VP2 of FIG. 6 and the predetermined memory cell reaches the second programming state P2 may vary according to memory cells. That is, fast cells $FC_2$ may reach the second programming state P2 after a programming loop a is executed thereon a relatively small number of times, and slow cells $SC_2$ may reach the second programming state P2 after a programming loop is executed thereon a relatively large number of times.

Referring to FIG. 7C, the number of times a programming loop is repeatedly executed until a threshold voltage of a predetermined memory cell exceeds the third verifying voltage VP3 of FIG. 6 and the predetermined memory cell reaches the third programming state P3 may vary according to memory cells. That is, fast cells $FC_3$ may reach the third programming state P3 by executing a programming loop a relatively small number of times, and slow cells $SC_3$ may reach the third programming state P3 by executing a programming loop a relatively large number of times.

As such, there may exist memory cells whose threshold voltages are rapidly changed and memory cells whose threshold voltages are slowly changed when a programming loop is executed.

Figure 8A:
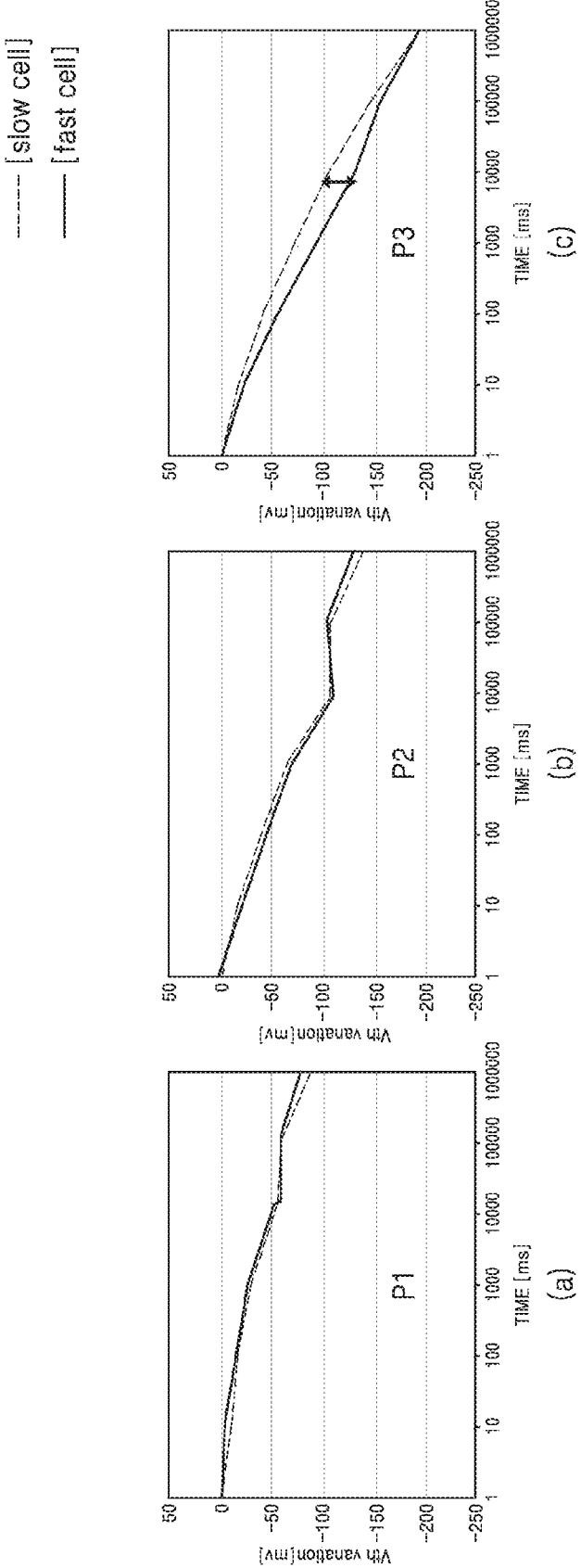
FIGS. 8A and 8B illustrate graphs showing a change in a threshold voltage of a memory cell according to memory cell characteristics and temperature.
Figure 8B:
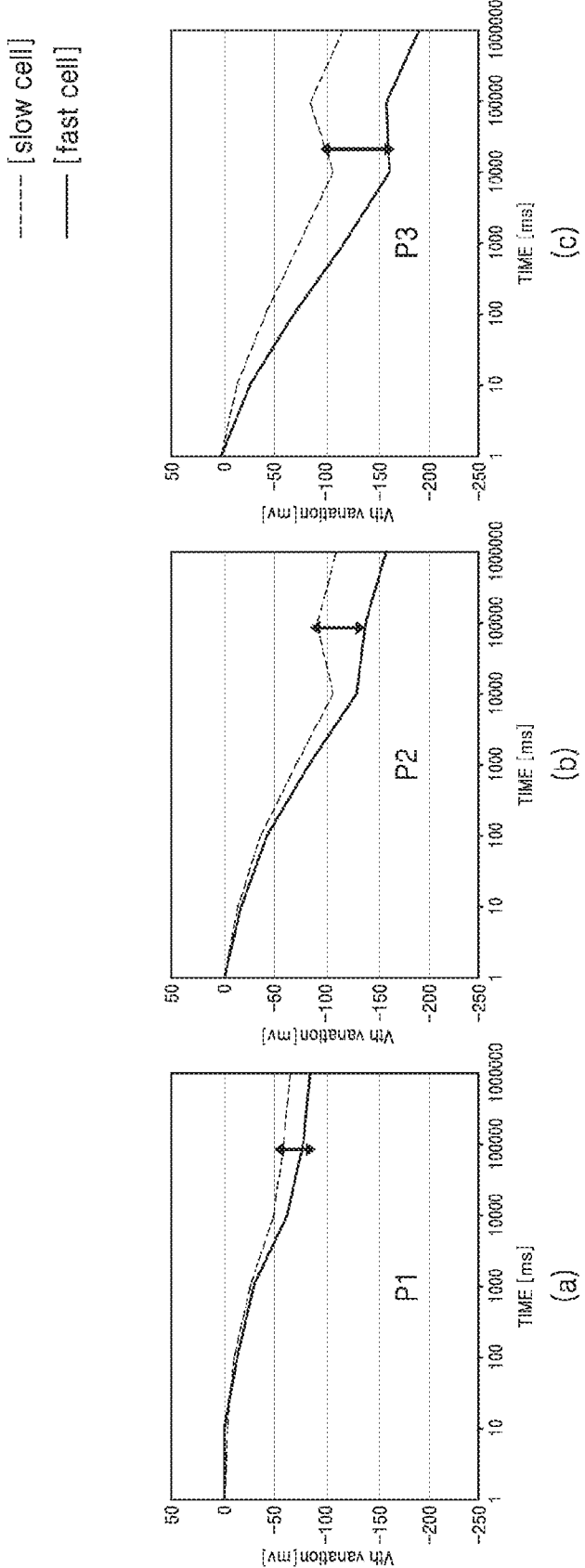

FIGS. 8A and 8B illustrate graphs showing a change in a threshold voltage of a memory cell according to memory cell characteristics and a temperature. In FIGS. 8A and 8B, the vertical axes of the graphs represent threshold voltage, and the horizontal axes represent time.

FIG. 8A illustrates graphs showing a relationship between a threshold voltage of memory cells and a time under a first temperature condition. A graph (a) in FIG. 8A illustrates a change in a threshold voltage of memory cells having the first programming state P1. A graph (b) in FIG. 8A illustrates a change in a threshold voltage of memory cells having the second programming state P2. Also, a graph (c) in FIG. 8A illustrates a change in a threshold voltage of memory cells having the third programming state P3. Referring to FIG. 8A, a change amount of a threshold voltage per time increases as a programming state has a greater threshold voltage, and a change amount of a threshold voltage of a fast cell per time is greater than a change amount of a threshold voltage of a slow cell per time.

FIG. 8B illustrates graphs showing a relationship between a threshold voltage of memory cells and a time under a second temperature condition. The second temperature condition may have a temperature lower than a temperature of the first temperature condition. For example, the first temperature condition may correspond to a temperature of 80° C. and the second temperature condition may correspond to a temperature of −10° C. Referring to FIG. 8B, a change amount of a threshold voltage per time increases as a programming state has a greater threshold voltage, and a change amount of a threshold voltage of a fast cell per time is greater than a change amount of a threshold voltage of a slow cell per time. Furthermore, a difference between a change amount of a threshold voltage of a fast cell per time and a change amount of a threshold voltage of a slow cell per time increases as a temperature of a temperature condition decreases.

Figure 9A:
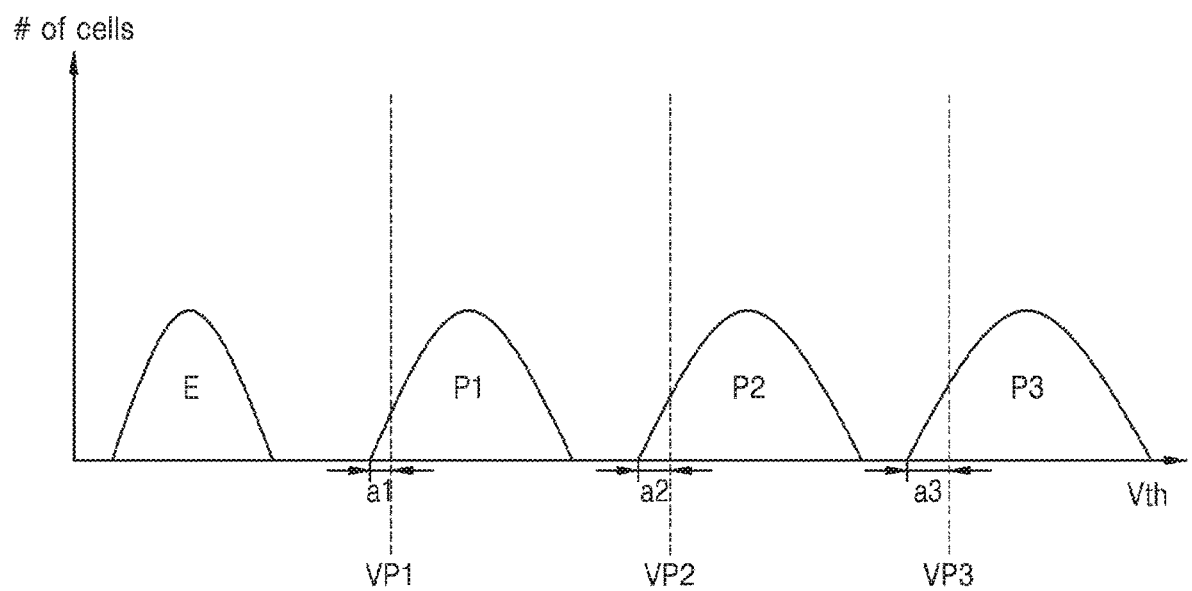
FIGS. 9A and 9B illustrate graphs showing a threshold voltage distribution according to characteristics of a memory cell of FIG. 8.
Figure 9B:
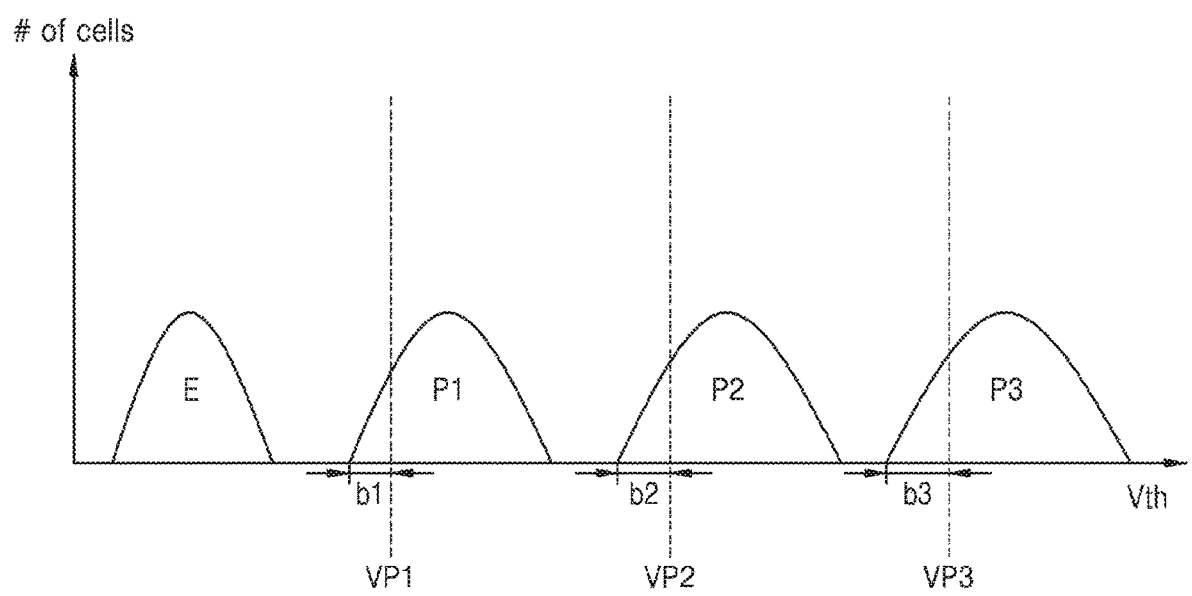

FIGS. 9A and 9B illustrate graphs showing a threshold voltage distribution according to memory cell characteristics of FIGS. 8A and 8B. In FIGS. 9A and 9B, the vertical axes represent a number of programmed memory cells, and the horizontal axes represent a threshold voltage.

As shown in FIG. 9A, since a threshold voltage of memory cells varies as time passes, a threshold voltage distribution of memory cells after a programming operation is completed may be changed. For example, a threshold voltage of some memory cells having the first programming state P1 may be shifted leftward by a first interval a1, a threshold voltage of some memory cells having the second programming state P2 may be shifted leftward by a second interval a2, and a threshold voltage of some memory cells having the third programming state P3 may be shifted leftward by a third interval a3. In this case, a change amount of a threshold voltage distribution may increase as memory cells have a programming state requiring a higher verifying voltage level in order to perform a verifying operation, that is, have a higher threshold voltage, and thus the third interval a3 may be greater than the second interval a2 and the second interval a2 may be greater than the first interval a1.

As shown in FIG. 9B, since a difference between a change amount of a threshold voltage of a fast cell per time and a change amount of a threshold voltage of a slow cell per time increases as a temperature condition decreases, a change amount of a threshold voltage distribution of memory cells under a temperature condition having a temperature lower than that in FIG. 9A may be greater than that in FIG. 9A. That is, a threshold voltage of some memory cells having the first programming state P1 may be shifted leftward by a first interval b1, a threshold voltage of some memory cells having the second programming state P2 may be shifted leftward by a second interval b2, and a threshold voltage of some memory cells having the third programming state P3 may be shifted leftward by a third interval b3. The first through third intervals b1 through b3 of FIG. 9B may be respectively greater than the first through third intervals a1 through a3 of FIG. 9A.

Figure 10:
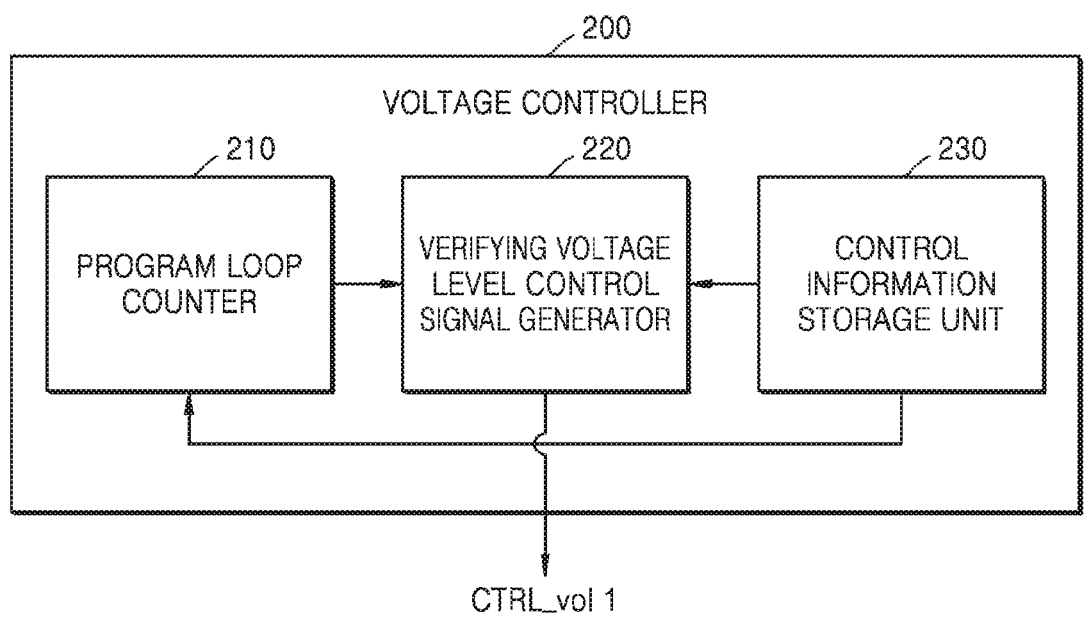
FIG. 10 illustrates a block diagram of a voltage controller according to an embodiment of the inventive concept.
Figure 12A:
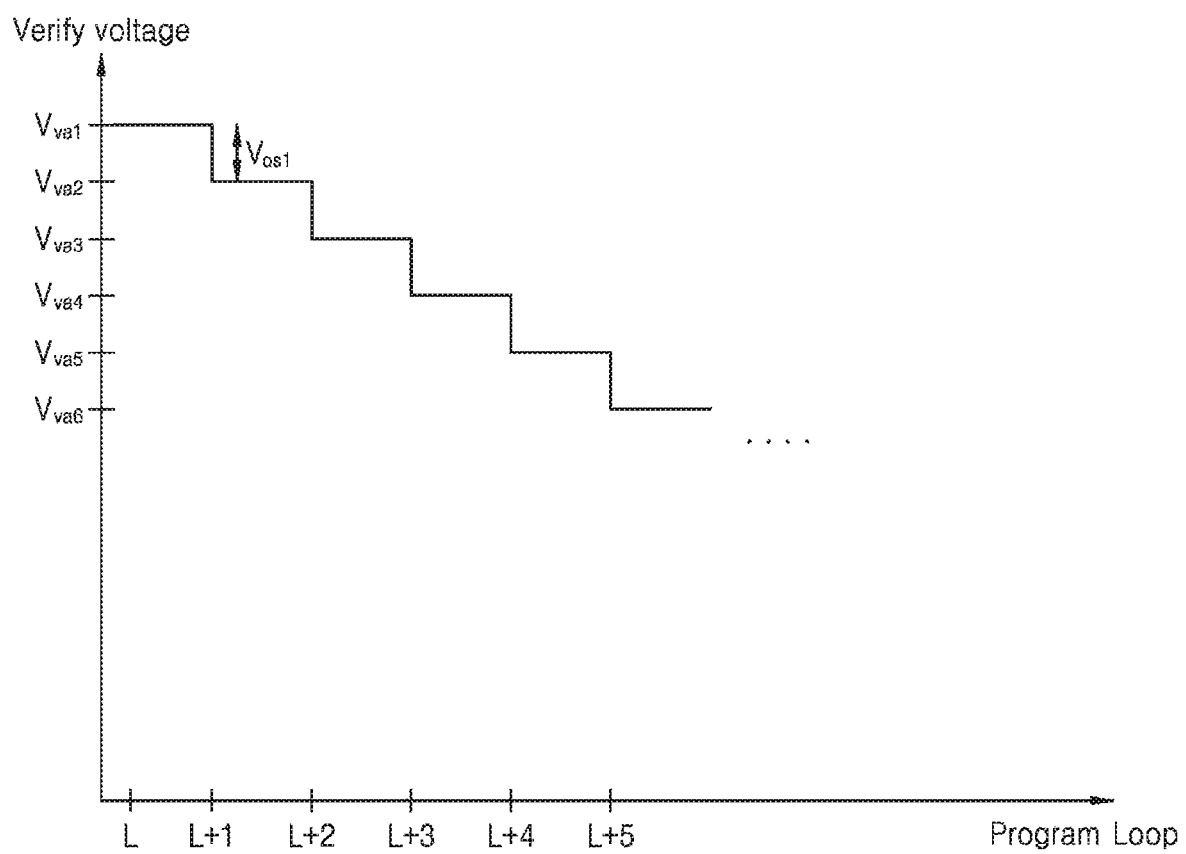
FIGS. 12A, 12b and 12C illustrate graphs for explaining an operation of the voltage controller to control changing of a level of a verifying voltage according to an embodiments of the inventive concept.
Figure 12B:
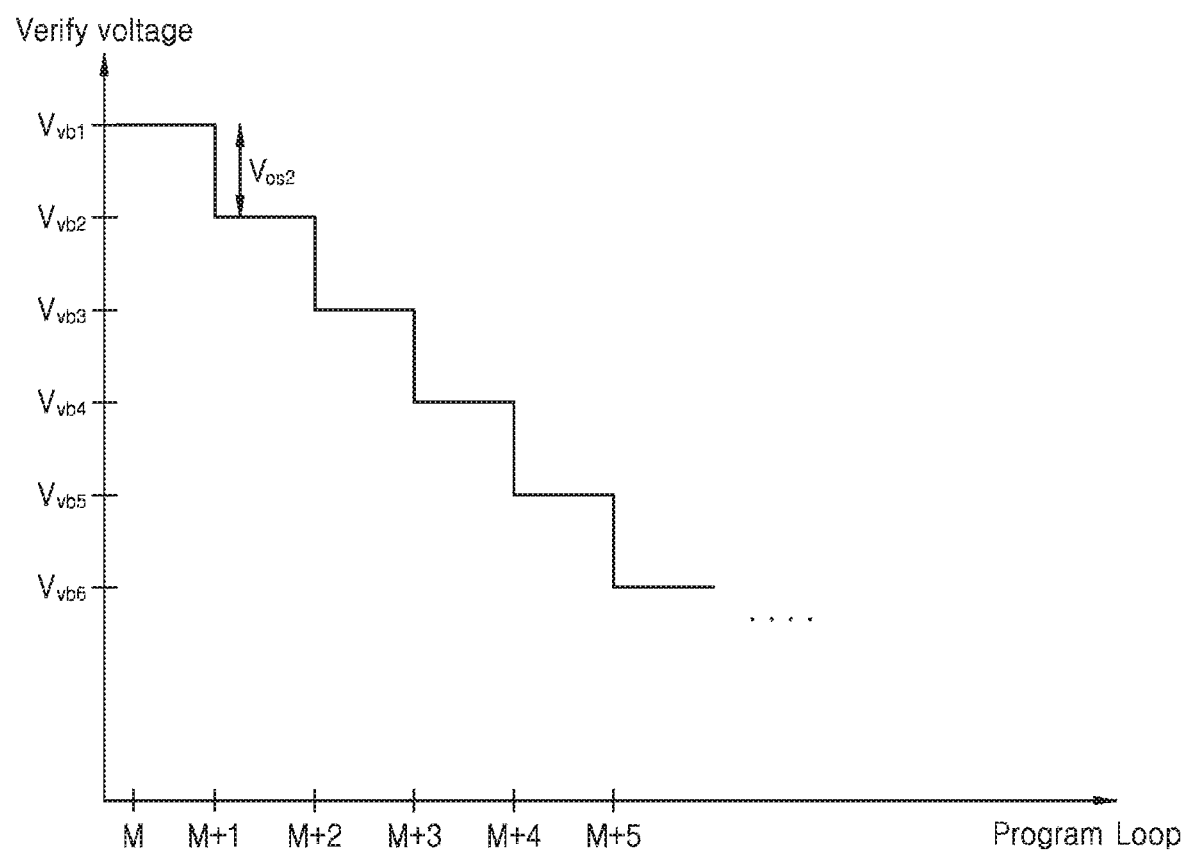
Figure 12C:
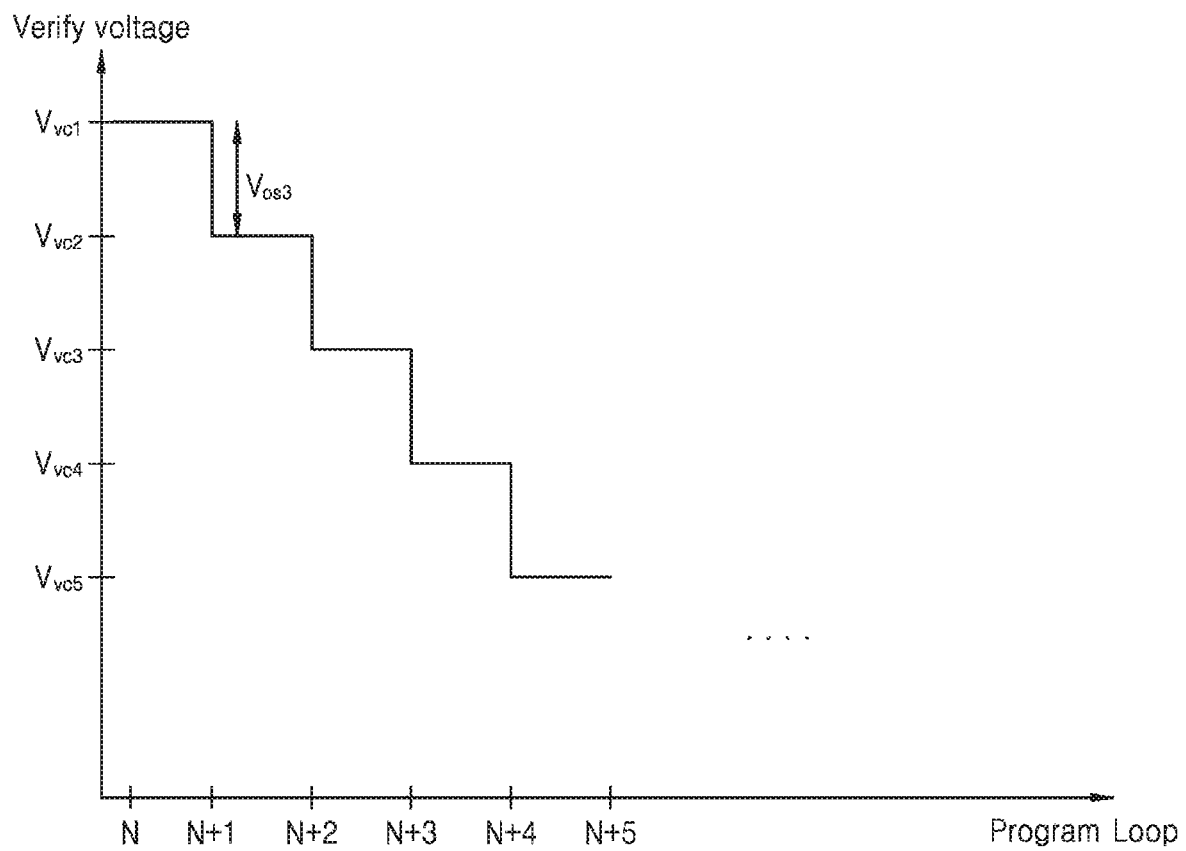

FIG. 10 illustrates a block diagram of a voltage controller 200 according to an embodiment of the inventive concept. FIGS. 11A and 11B illustrate diagrams of control information needed during an operation of the voltage controller 200 according to embodiments of the inventive concept. FIGS. 12A through 12C illustrate graphs for explaining an operation of the voltage controller 200 to control changing of a level of a verifying voltage according to an embodiments of the inventive concept. The voltage controller 200 may correspond to the voltage controller 121 of control logic 120 shown in FIG. 2. Also, in FIGS. 12A-12C the vertical axes represent a verify voltage, and the horizontal axes represent a program loop.

Referring to FIG. 10, the voltage controller 200 includes a program loop counter 210, a verifying voltage level control signal generator 220, and a control information storage unit 230. The program loop counter 210 counts the number of times a programming loop is executed on memory cells. In an embodiment, the program loop counter 210 may count the number of repetitions of a programming loop by counting a number of pulses when a programming voltage is stepped up. The program loop counter 210 may generate program loop count information by counting the number of repetitions of a programming loop and may send the program loop count information to the verifying voltage level control signal generator 220. Also, in an embodiment (which will be described later with respect to FIG. 14A for example), the program loop counter 210 may control the verifying voltage level control signal generator 220 to be activated/deactivated based on the program loop count information provided from the control information storage unit 230.

The verifying voltage level control signal generator 220 generates a voltage control signal CTRL_vol1 for controlling a verifying voltage generated by a voltage generator, the verifying voltage to be generated having a level that varies as a program loop count increases. The verifying voltage level control signal generator 220 may receive control information for controlling changing of a verifying voltage from the control information storage unit 230, and may receive the program loop count information from the program loop counter 210. The verifying voltage level control signal generator 220 may control changing of a level of a verifying voltage by using the program loop count information and the control information.

The control information storage unit 230 may store pieces of control information needed to change a level of a verifying voltage. The pieces of control information may include a change start verify voltage level parameter, a level change degree parameter, and a level change start loop parameter, and may further include a program loop number parameter and a verifying voltage level parameter corresponding to the program loop number parameter. The pieces of control information may be stored in the ROM fuse 112 when the memory device 100 of FIG. 2 is turned off and may be loaded to the control information storage unit 230 when the memory device 100 is turned on. The control information storage unit 230 may apply the pieces of control information to the verifying voltage level control signal generator 220. However, the inventive concept is not limited thereto, and the verifying voltage level control signal generator 220 may directly receive the pieces of control information from the ROM fuse 112.

Referring to FIG. 11A, the control information stored in control information storage unit 230 may include control parameters including a change start verify voltage level parameter SVL, a level change degree parameter LCD, and a level change start loop parameter SL according to each programming state to be verified (e.g., P1, P2 and P3). The change start verify voltage level parameter SVL is a parameter that is referred to in order to control a start level of a verifying voltage when the voltage controller 200 starts to control changing of a level of the verifying voltage. The level change degree parameter LCD is a parameter that is referred to in order to control, when the voltage controller 200 controls changing of a level of the verifying voltage, a level change degree of the verifying voltage. The level change start loop parameter SL is a parameter that is referred to in order for the voltage controller 200 to control a level change start timing of a verifying voltage. The verifying voltage level control signal generator 220 may generate the voltage control signal CTRL_vol1 for controlling the voltage generator by using the above control information.

Referring to FIG. 11B, the control information stored in control information storage unit 230 may further include control parameters including a verifying voltage level parameter VVL and a program loop number parameter PLN according to each programming state to be verified (e.g., P1, P2 and P3). The program loop number parameter PLN and the verifying voltage level parameter VVL may be parameters that are referred to in order for the voltage controller 200 to generate a verifying voltage having a predetermined level when a predetermined programming loop is executed. The verifying voltage level control signal generator 220 may generate the voltage control signal CTRL_vol1 for controlling the voltage generator by using the above control information.

An operation of the voltage controller 200 to control changing of a level of the first verifying voltage VP1 for verifying the first programming state P1 of FIG. 6 will now be explained with reference to FIGS. 10, 11A, and 12A. In an embodiment, the voltage controller 200 may control generation of a first verifying voltage (by voltage generator 130 of FIG. 2) whose level gradually decreases as a programming loop is executed on memory cells. That is, a verifying voltage whose level decreases as a programming loop is executed as L, L+1, . . . may be generated as shown in FIG. 12A. Also, the voltage controller 200 may control generation of a verifying voltage whose level gradually decreases by a predetermined level change degree from a level of a change start verify voltage. In an embodiment, the voltage controller 200 may set the change start verify voltage to a 1-1 verifying voltage $V_{va1}$ for programming loop L by using the change start verify voltage level parameter SVL, and may set a level change degree to a first offset voltage $V_{os1}$ by using the level change degree parameter LCD. The voltage controller 200 may control generation of a first verifying voltage whose level decreases by the first offset voltage $V_{os1}$ from the 1-1 verifying voltage $V_{va1}$ as a programming loop is executed.

As shown in FIG. 12A as an example, the 1-1 verifying voltage $V_{va1}$ for programming loop L is decreased by the first offset voltage $V_{os1}$ to 1-2 verifying voltage $V_{va2}$ for programming loop L+1. That is, for example, the 1-2 verifying voltage $V_{va2}$ having a second level which is less than a first level (the 1-1 verifying voltage $V_{va1}$) is applied to memory cells that fail to pass the verifying operation using the first level verifying voltage. As further shown, the 1-2 verifying voltage $V_{va2}$ for programming loop L+1 is decreased by the first offset voltage $V_{os1}$ to 1-3 verifying voltage $V_{va3}$ for programming loop L+2. The 1-3 verifying voltage $V_{va3}$ for programming loop L+2 is decreased by the first offset voltage $V_{os1}$ to 1-4 verifying voltage $V_{va4}$ for programming loop L+3. The 1-4 verifying voltage $V_{va4}$ for programming loop L+3 is decreased by the first offset voltage $V_{os1}$ to 1-5 verifying voltage $V_{va5}$ for programming loop L+4. The 1-5 verifying voltage $V_{va5}$ for programming loop L+4 is decreased by the first offset voltage $V_{os1}$ to 1-6 verifying voltage $V_{va6}$ for programming loop L+5. Incidentally, in this description a 1-1 verifying voltage should be understood whereby the notation "1-1" is indicative of a first verifying voltage (e.g., VP1 in FIG. 6) during a first programming loop. Likewise, a 1-2 verifying voltage may be indicative of a first verifying voltage (e.g., VP1) during a second programming loop, and a 2-1 verifying voltage may be indicative of a second verifying voltage (e.g., VP2 in FIG. 6) during a first programming loop.

In an embodiment, the change start verify voltage may have a level higher than a level of a verifying voltage for verifying a programming state. For example, a level of the 1-1 verifying voltage $V_{va1}$ may be higher than a level of a verifying voltage conventionally generated to verify a first programming state.

In this manner, a level of a verifying voltage may be changed in consideration that a threshold voltage of memory cells gradually decreases as a time passes and a change amount of a threshold voltage of a fast cell is greater than a change amount of a threshold voltage of a slow cell. Accordingly, memory cells of a memory device according to the inventive concept may have a constant threshold voltage distribution even when a predetermined period of time passes, thereby improving the reliability of the memory device.

In another embodiment, the voltage controller 200 may control a level of a verifying voltage to be changed in programming loops after a level change start loop. For example, the voltage controller 200 may set an $L^{th}$ programming loop to a level change start loop by using the level change start loop parameter SL. The voltage controller 200 may control a level of a first verifying voltage to be changed in programming loops L+1, L+2, . . . after the $L^{th}$ programming loop. In this manner, the voltage controller 200 may control verifying voltages for verifying programming states to have different level change start timings. Since levels of verifying voltages may be sequentially changed, instead of being changed all at once, as a program loop count increases, an efficient operation may be performed.

An embodiment of an operation of the voltage controller 200 for controlling changing of a level of the first verifying voltage VP1 for verifying the first programming state P1 of FIG. 6 will now be explained with reference to FIGS. 10, 11B, and 12A. The voltage controller 200 may compare program loop count information generated by the program loop counter 210 with control information, and may control a level of a first verifying voltage to be changed by using the control information level parameter VVL corresponding to a comparison result. For example, first, when the program loop counter 210 generates program loop count information indicating an $L^{th}$ programming loop, the voltage controller 200 may compare the program loop count information with the program loop number parameter PLN and may control a first verifying voltage to have a level of the 1-1 verifying voltage $V_{va1}$ by using the verifying voltage level parameter VVL corresponding to a comparison result. Next, when the program loop counter 210 generates program loop count information indicating an $L+1^{th}$ programming loop, the voltage controller 200 may compare the program loop count information with the program loop number parameter PLN and may control the first verifying voltage to have a level of a 1-2 verifying voltage $V_{va2}$ by using the verifying voltage level parameter VVL corresponding to a comparison result. In this manner, the voltage controller 200 may control a level of a second verifying voltage for verifying a second programming state of memory cells and a level of a third verifying voltage for verifying a third programming state of the memory cells. However, the inventive concepts are not limited thereto, and any of various other methods of changing a level of a verifying voltage may be used.

An operation of the voltage controller 200 to control changing of a level of the second verifying voltage VP2 for verifying the second programming state P2 of FIG. 6 will now be explained with reference to FIGS. 10, 11A, and 12B. In an embodiment, the voltage controller 200 may control generation of a second verifying voltage whose level gradually decreases as a programming loop is executed on memory cells.

There is a difference from FIG. 12A in that the voltage controller 200 may set a change start verify voltage to the 2-1 verifying voltage $V_{vb1}$ by using the change start verify voltage level parameter SVL and may set a level change degree to a second offset voltage $V_{os2}$ by using the level change degree start loop parameter SL. The second offset voltage $V_{os2}$ may have a level that is higher than that of the first offset voltage $V_{os1}$, and the 2-1 verifying voltage $V_{vb1}$ may have a level that is higher than that the 1-1 verifying voltage $V_{va1}$. As shown in FIG. 12B as an example, the 2-1 verifying voltage $V_{vb1}$ for programming loop M is decreased by the second offset voltage $V_{os2}$ to 2-2 verifying voltage $V_{vb2}$ for programming loop M+1. The 2-2 verifying voltage $V_{vb2}$ for programming loop M+1 is decreased by the second offset voltage $V_{os2}$ to 2-3 verifying voltage $V_{vb3}$ for programming loop M+2. The 2-3 verifying voltage $V_{vb3}$ for programming loop M+2 is decreased by the second offset voltage $V_{os2}$ to 2-4 verifying voltage $V_{vb4}$ for programming loop M+3. The 2-4 verifying voltage $V_{vb4}$ for programming loop M+3 is decreased by the second offset voltage $V_{os2}$ to 2-5 verifying voltage $V_{vb5}$ for programming loop M+4. The 2-5 verifying voltage $V_{vb5}$ for programming loop M+4 is decreased by the second offset voltage $V_{os2}$ to 2-6 verifying voltage $V_{vb6}$ for programming loop M+5.

An operation of the voltage controller 200 to control changing of a level of the third verifying voltage VP3 for verifying the third programming state P3 of FIG. 6 will now be explained with reference to FIGS. 10, 11A, and 12C. In an embodiment, the voltage controller 200 may control generation of a third verifying voltage whose level gradually decreases as a programming loop is executed on memory cells.

There is a difference from FIG. 12A in that the voltage controller 200 may set a change start verify voltage to a 3-1 verifying voltage $V_{vc1}$ by using the change start verify voltage level parameter SVL, and may set a level change degree to a third offset voltage $V_{os3}$ by using the level change degree parameter LCD. Also, the voltage controller 200 may set an IN programming loop to a level change start loop by using the level change start loop parameter SL. The third offset voltage $V_{os3}$ may have a level that is higher than that of the second offset voltage $V_{os2}$ and the 3-1 verifying voltage $V_{vc1}$ may have a level that is higher than that of the 2-1 verifying voltage $V_{vb1}$. As shown in FIG. 12C as an example, the 3-1 verifying voltage $V_{vc1}$ for programming loop N is decreased by the third offset voltage $V_{os3}$ to 3-2 verifying voltage $V_{vc2}$ for programming loop N+1. The 3-2 verifying voltage $V_{vc2}$ for programming loop N+1 is decreased by the third offset voltage $V_{os3}$ to 3-3 verifying voltage $V_{vc3}$ for programming loop N+2. The 3-3 verifying voltage $V_{vc3}$ for programming loop N+2 is decreased by the third offset voltage $V_{os3}$ to 3-4 verifying voltage $V_{vc4}$ for programming loop N+3. The 3-4 verifying voltage $V_{vc4}$ for programming loop N+3 is decreased by the third offset voltage $V_{os3}$ to 3-5 verifying voltage $V_{vc5}$ for programming loop N+4.

As such, the voltage controller 200 may control levels of a first verifying voltage, a second verifying voltage, and a third verifying voltage to be differently changed. Since a change amount of a threshold voltage increases as memory cells have a higher threshold voltage as described with reference to FIGS. 8A and 8B, in order to form a desired threshold voltage distribution, the voltage controller 200 may change voltage levels so that a level change degree of a third verifying voltage is greater than a level change degree of a second verifying voltage (i.e., $V_{os3} > V_{os2}$), and the level change degree of the second verifying voltage is greater than a level change degree of a first verifying voltage (i.e., $V_{os2} > V_{os1}$). The voltage controller 200 may control the voltage generator so that a level difference between the 1-1 verifying voltage $V_{va1}$ that is a change start verify voltage of the first verifying voltage and a change start verify voltage $V_{vb1}$ of the second verifying voltage is less than a level difference between the change start verify voltage $V_{vb1}$ of the second verifying voltage and a change start verify voltage $V_{vc1}$ of the third verifying voltage. That is, the voltage controller 200 may control a level difference between adjacent verifying voltages to increase as verifying voltages have higher levels. Also, the voltage controller 200 may control verifying voltages to be changed by differently setting programming loops in which levels of the verifying voltages start to be changed, thereby making it possible to efficiently change a level.

FIGS. 13A, 13B, 13C and 13D illustrate graphs for explaining an operation of the voltage controller 200 to control changing of a level of a verifying voltage according to various embodiments of the inventive concept.

Figure 13A:
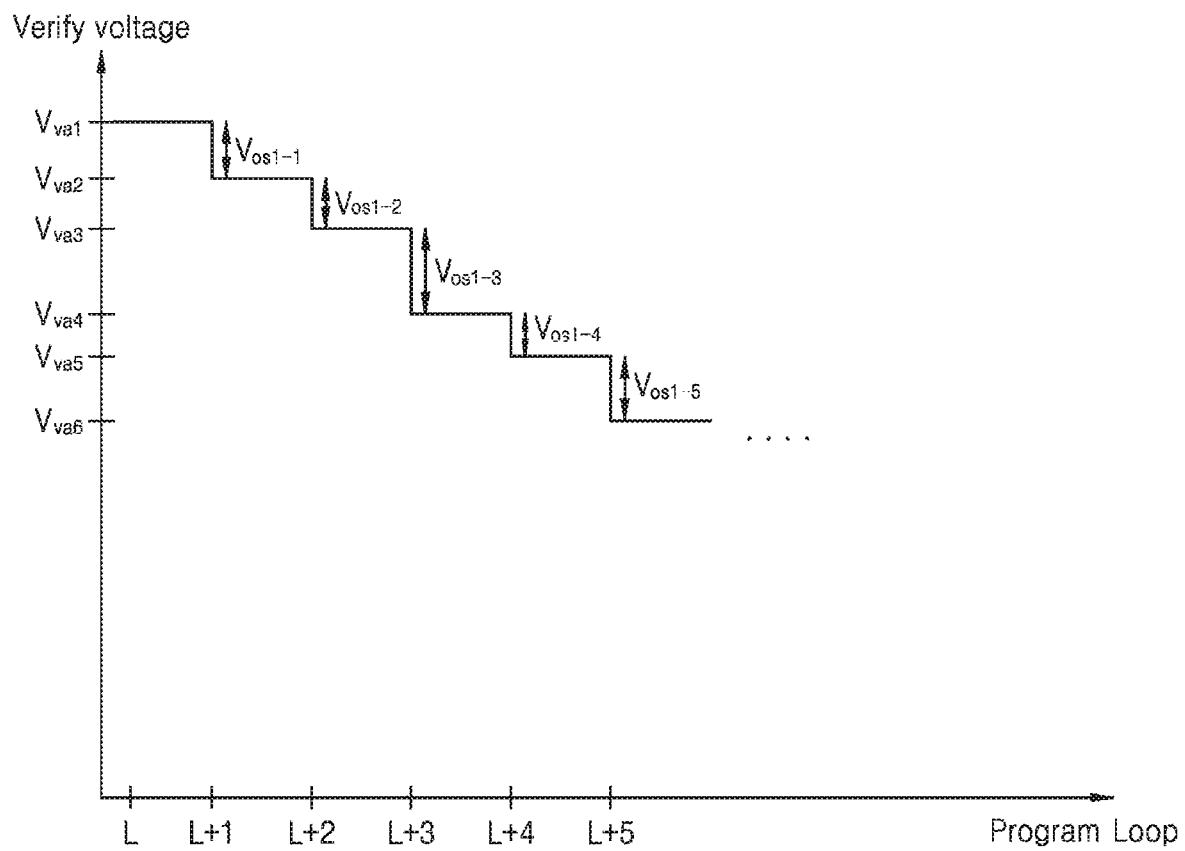
FIGS. 13A, 13B, 13C and 13D illustrate graphs for explaining an operation of the voltage controller to control changing of a level of a verifying voltage according to various embodiments of the inventive concept.

Referring to FIGS. 10 and 13A, the voltage controller 200 may control a level of a first verifying voltage to be changed by a level change degree that varies according to each programming loop, in contrast to the embodiment described with respect to FIG. 12A. The voltage controller 200 may change a level of a first verifying voltage by the first offset voltage $V_{os1}$ that is a constant level change degree in the embodiment described with respect to FIG. 12A, whereas the voltage controller 200 may change a level of a first verifying voltage by any of offset voltages $V_{os1-1}$ through $V_{os1-5}$ that are different from one another for programming loops L+1 through L+5 in the embodiment described with respect to FIG. 13A.

Figure 13B:
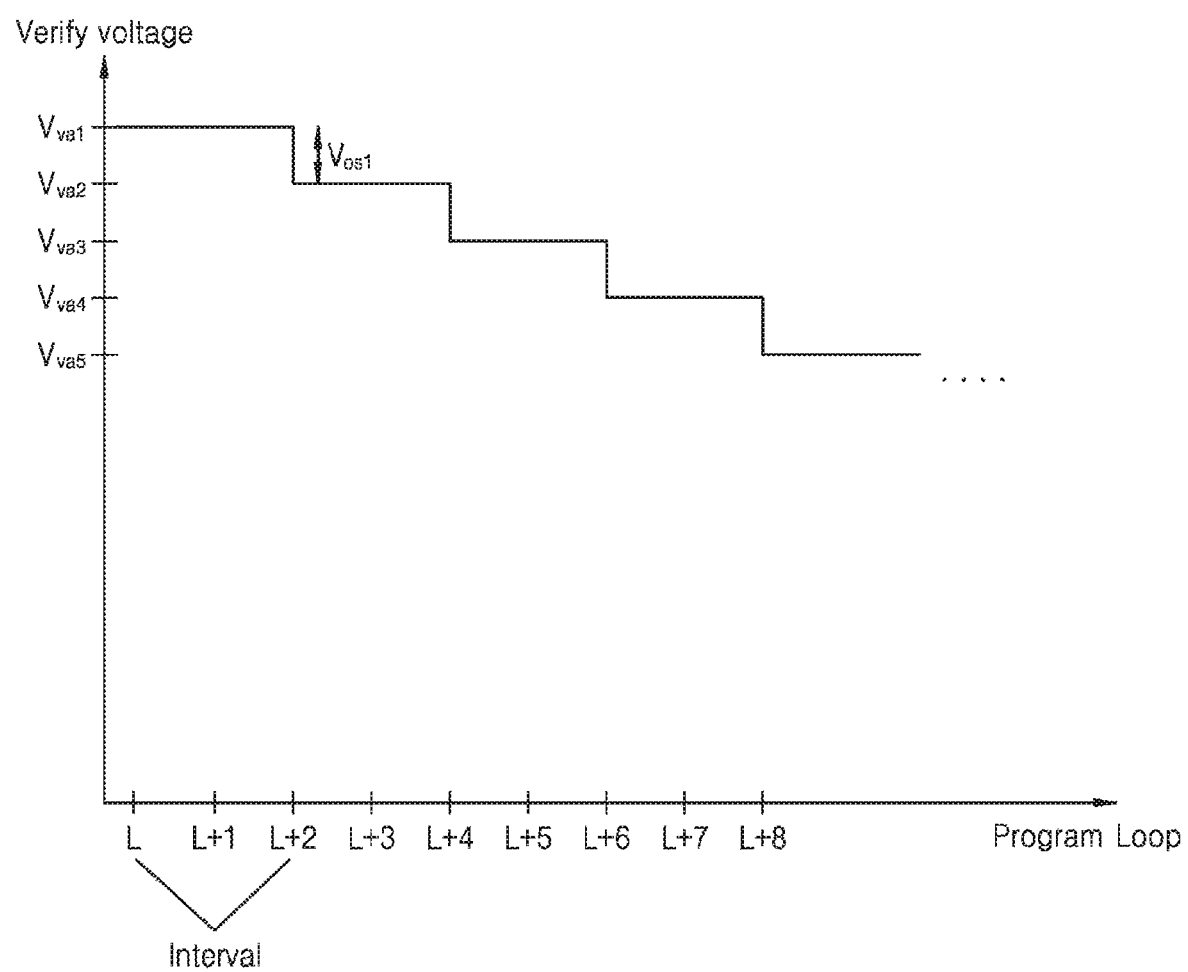

Referring to FIGS. 10 and 13B, the voltage controller 200 may control a level of a first verifying voltage to be changed at every predetermined loop interval, in contrast to the embodiment described with respect to FIG. 12A. That is, the voltage controller 200 may control a level of a verifying voltage to be changed at every predetermined loop interval, instead of being changed at every programming loop. In an embodiment, control information may further include a loop interval parameter, and the voltage controller 200 may control a level of a verifying voltage to be changed by using the loop interval parameter. The loop interval as shown in FIG. 13B is two programming loops. However, the inventive concepts are not limited thereto, and any of various other loop intervals may be set. In another embodiment, the predetermined loop interval may not be fixed, and may vary as a program loop count increases.

Figure 13C:
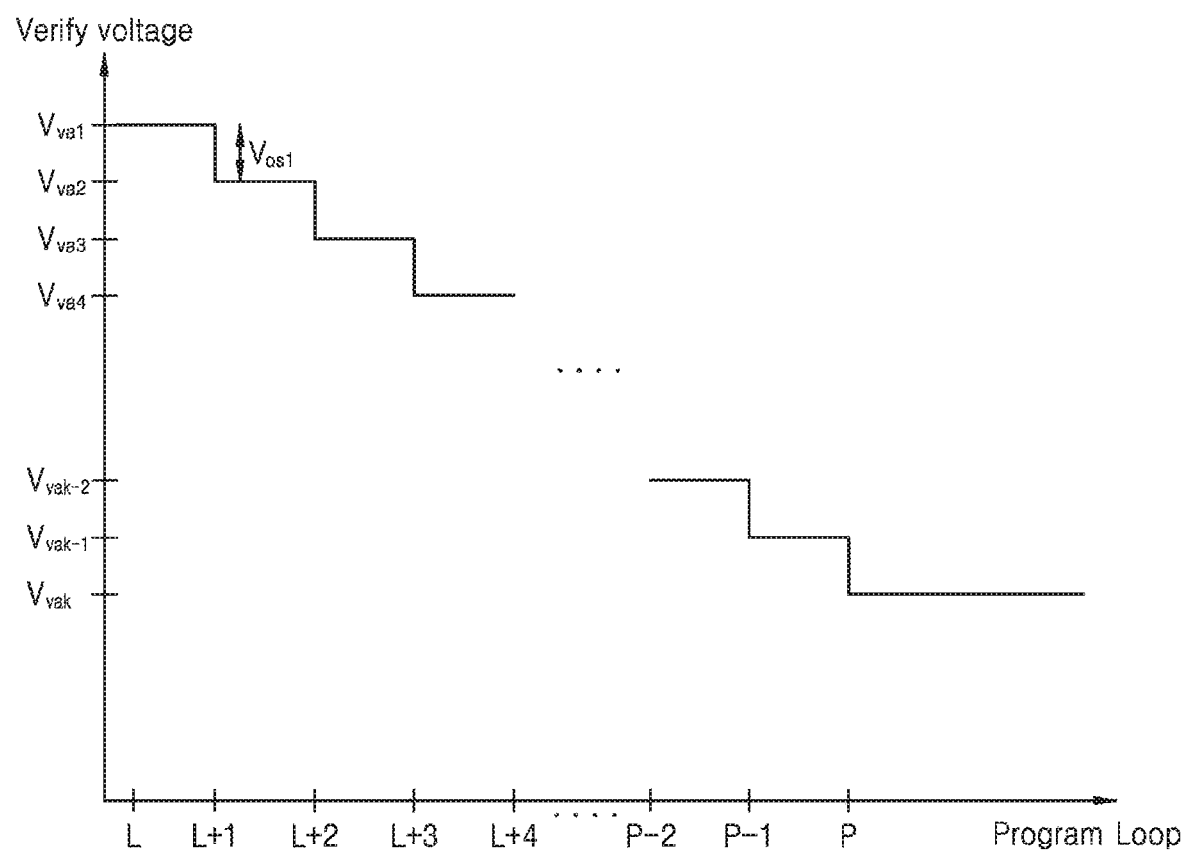

Referring to FIGS. 10 and 13C, the voltage controller 200 may control a level of a first verifying voltage to be fixed after a programming loop is executed on memory cells a predetermined number of times, in contrast to the embodiment described with respect to FIG. 12A. For example, the voltage controller 200 may control a level of at least one verifying voltage from among the first verifying voltage VP1, the second verifying voltage VP2, and the third verifying voltage VP3 of FIG. 6 to be fixed after a specific programming loop. That is, the voltage controller 200 may control a first verifying voltage to be a level of a predetermined verifying voltage $V_{vak}$ after a $P^{th}$ programming loop P. However, the inventive concept is not limited thereto, and the voltage controller 200 may control a level of the first verifying voltage to be changed again after a P+$3^{th}$ programming loop (not shown) for example, and various other modifications may be made.

Figure 13D:
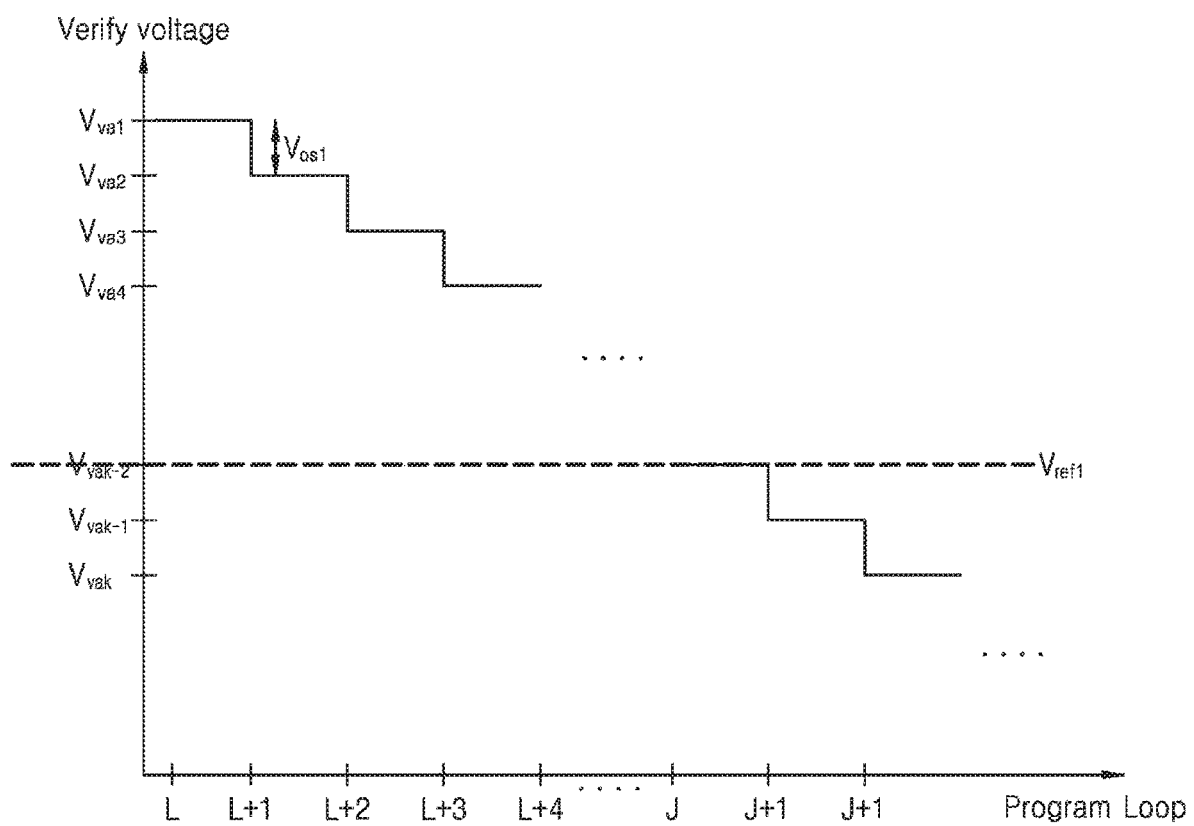

Referring to FIGS. 10 and 13D, the voltage controller 200 may control a first verifying voltage to have a level that is higher than a level of a first reference voltage $V_{ref1}$ corresponding to the first verifying voltage while programming loops L through J+1 are initially performed, and may control the first verifying voltage to have a level that is lower than the level of the first reference voltage $V_{ref1}$ corresponding to the first verifying voltage while the programming loops J+1 through . . . are subsequently performed. In an embodiment, the first reference voltage $V_{ref1}$ may correspond to a conventional verifying voltage for verifying a first programming state. Furthermore, the voltage controller 200 may control a level of any of verifying voltages other than the first verifying voltage to be lower than a level of each corresponding reference voltage, and thus a program loop count needed to complete a programming operation may be reduced, thereby rapidly performing the programming operation. Also, control information stored in the control information storage unit 230 may include a reference voltage parameter corresponding to each verifying voltage, and the voltage controller 200 may control a verifying operation to be performed by using a reference voltage having a constant level without changing a level of a verifying voltage by using the reference voltage parameter. Also, in an embodiment, a change start verify voltage level parameter may be generated by using the reference voltage parameter and a level change degree parameter.

Changing of levels of verifying voltages may be controlled by selecting a control method suitable for a programming operation condition of a memory device from among various control methods of the voltage controller 200 as described with respect to FIGS. 13A through 13D. Also, the various control methods of the voltage controller 200 as described with respect to FIGS. 13A through 13D may be used to control changing of levels of a second verifying voltage and a third verifying voltage, and may also be used to control changing of a level of a verifying voltage of memory cells that may store three or more bits of data and single-level cells SLCs.

Figure 14A:
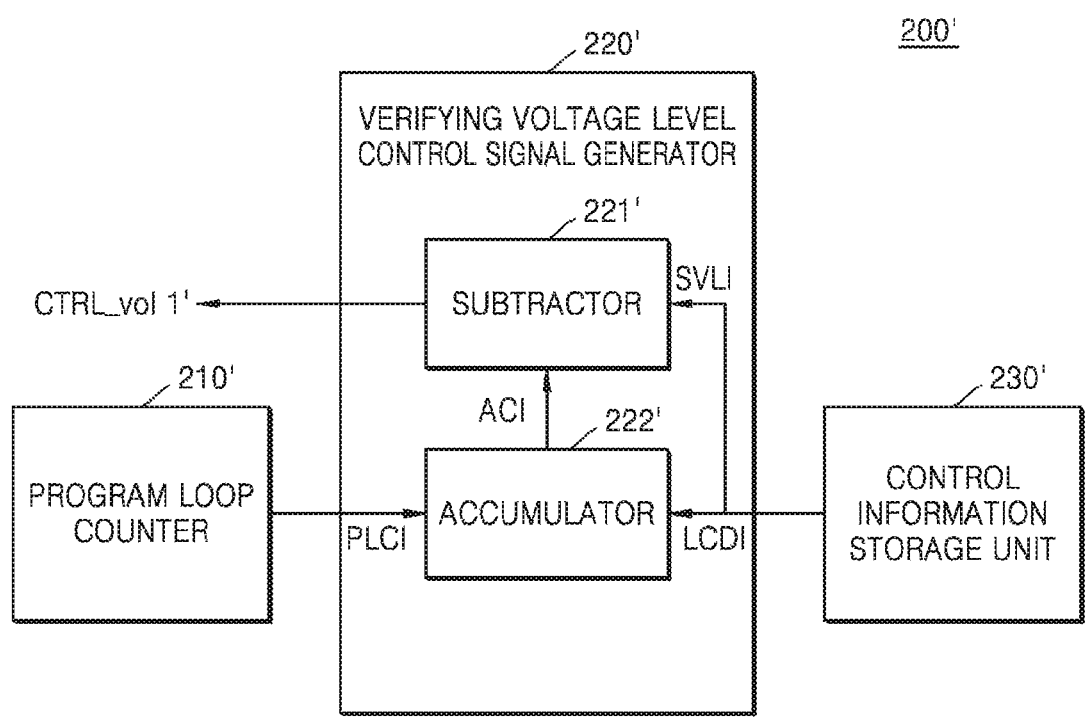
FIGS. 14A and 14B each illustrate a block diagram for explaining a control operation of a voltage controller according to embodiments of the inventive concept.
Figure 14B:
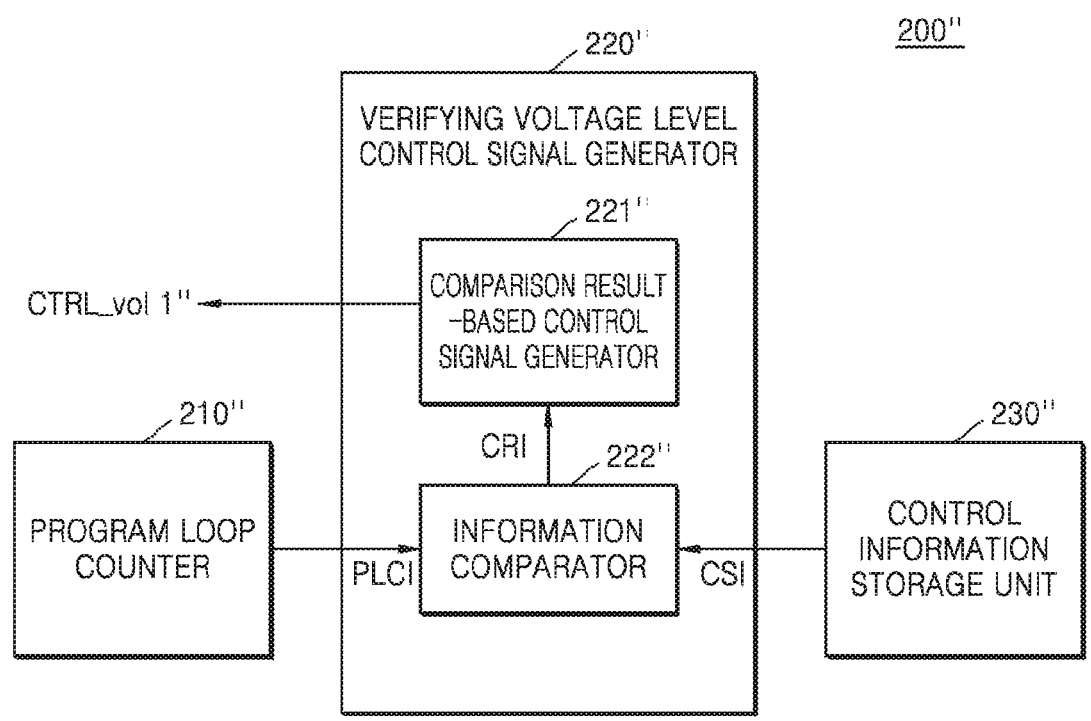

FIGS. 14A and 14B each illustrate a block diagram for explaining a control operation of a voltage controller according to embodiments of the inventive concept.

Referring to FIG. 14A, a voltage controller 200' includes a program loop counter 210', a verifying voltage level control signal generator 220', and a control information storage unit 230'. The verifying voltage level control signal generator 220' includes a subtractor 221' and an accumulator 222'. The accumulator 222' receives program loop count information PLCI from the program loop counter 210'. Also, the accumulator 222' receives level change degree information LCDI from the control information storage unit 230'. The accumulator 222' may generate accumulation information ACI including an accumulation amount obtained by accumulating a level change degree corresponding to the level change degree information LCDI whenever the program loop count information PLCI is received. The accumulator 222' may transmit the accumulation information ACI to the subtractor 221'. The subtractor 221' receives change start verifying voltage level information SVLI from the control information storage unit 230'. The subtractor 221' generates a voltage control signal CTRL_vol1' after subtracting the accumulation amount included in the accumulation information ACI from a change start verify voltage level corresponding to the change start verifying voltage level information SVLI. In an embodiment, the level change degree information LCDI may be the level change degree parameter LCD of FIG. 11A, and the change start verifying voltage level information SVLI may be the change start verify voltage level parameter SVL of FIG. 11A.

The voltage controller 200' may control changing of a level of a verifying voltage as shown in the graph of FIG. 12A or the like in this manner. Also, although not shown in FIG. 14A, in an embodiment, the program loop counter 210' may receive level change start loop information from the control information storage unit 230' and may control the accumulator 222' and the subtractor 221' to be activated/deactivated based on the level change start loop information. That is, the program loop counter 210' may compare the program loop count information PLCI with the level change start loop information and may activate the accumulator 222' and the subtractor 221' which were deactivated when the program loop count information PLCI and the level change start loop information are the same. In another embodiment, the voltage controller 200' may include an activation controller, and may control the accumulator 222' and the subtractor 221' to be activated/deactivated based on the level change start loop information and the program loop count information PLCI.

Referring to FIG. 14B, a voltage controller 200" includes a program loop counter 210", a verifying voltage level control signal generator 220", and a control information storage unit 230". The verifying voltage level control signal generator 220" includes a comparison result-based control signal generator 221" and an information comparator 222". The information comparator 222" may compare program loop count information PLCI generated by the program loop counter 210" with control information CSI and may generate a comparison result CRI. The information comparator 222" may transmit the comparison result CRI to the comparison result-based control signal generator 221". The comparison result-based control signal generator 221" may generate a voltage control signal CTRL_vol1" for controlling generation of a verifying voltage having a verifying voltage level corresponding to the comparison result CRI. For example, referring to FIG. 11B, when the program loop counter 210" generates program loop count information indicating an $L^{th}$ program loop, the information comparator 222" may compare the program loop count information with the program loop number parameter PLN (i.e., control information CSI) and may generate the voltage control signal CTRL_vol1" for controlling a first verifying voltage having a level of the 1-1 verifying voltage $V_{va1}$ to be generated by using the verifying voltage level parameter VVL corresponding to a comparison result.

FIG. 15 illustrates a block diagram for explaining an operation of a program loop counter 310 according to an embodiment of the inventive concept.

Referring to FIG. 15, a voltage controller 300 includes the program loop counter 310, a verifying voltage level control signal generator 320, and a control information storage unit 330. The verifying voltage level control signal generator 320 includes a first verifying voltage level control signal generator 321 that generates a control signal for changing a level of a first verifying voltage for verifying a first programming state, a second verifying voltage level control signal generator 323 that generates a control signal for changing a level of a second verifying voltage for verifying a second programming state, and a third verifying voltage level control signal generator 325 that generates a control signal for changing a level of a third verifying voltage for verifying a third programming state. However, the inventive concept is not limited thereto, and the voltage controller 300 of a memory device including memory cells that may store three or more bits of data or single-level cells SLCs may include more verifying voltage level control signal generators than described with respect to FIG. 15.

The program loop counter 310 may receive level change start loop information from the control information storage unit 330. The program loop counter 310 may control the first through third verifying voltage level control signal generators 321, 323, and 325 to be activated/deactivated by transmitting an enable/disable signal to each of the first through third verifying voltage level control signal generators 321, 323, and 325, based on the level change start loop information. That is, referring to FIG. 11A, since a level change start loop of a first verifying voltage for verifying the first programming state P1 is the $L^{th}$ program loop L, the program loop counter 310 may activate the first verifying voltage level control signal generator 321 when a program loop count corresponds to the $L^{th}$ program loop L. In this manner, the program loop counter 310 may activate the second and third verifying voltage level control signal generators 323 and 325 when a program loop count respectively corresponds to the $M^{th}$ program loop M and the Nth program loop N. In this manner, the voltage controller 300 may individually control changing of levels of verifying voltages for verifying programming states, thereby leading to efficient control.

Figure 16:
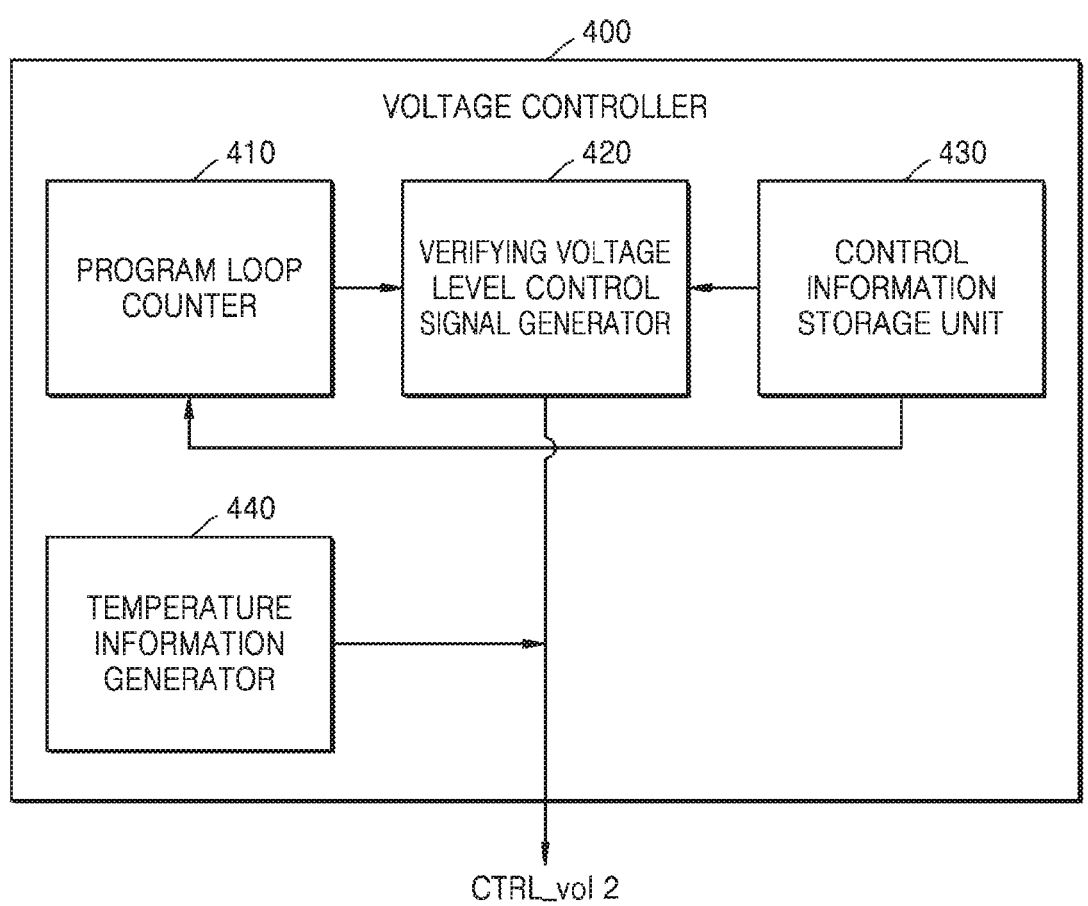
FIG. 16 illustrates a block diagram of a voltage controller according to another embodiment of the inventive concept.
Figure 17A:
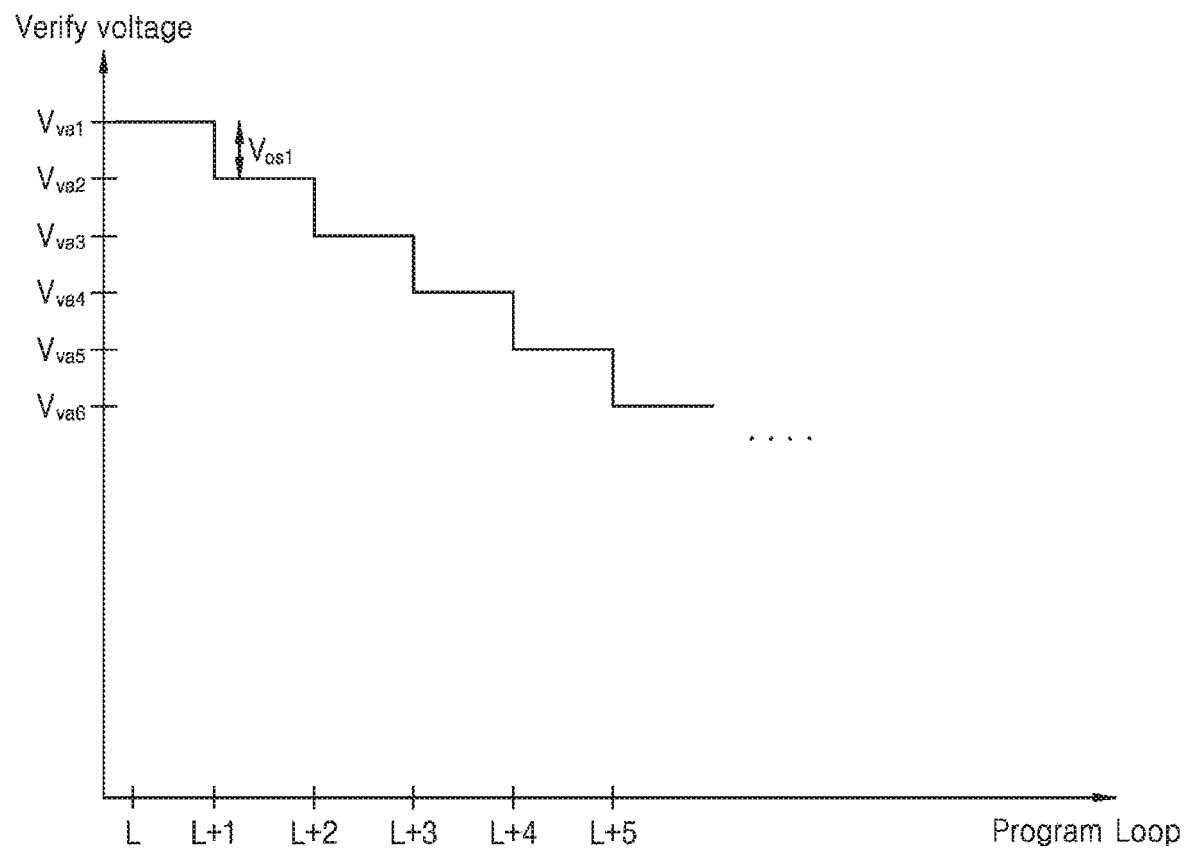
FIGS. 17A and 17B each illustrate a graph for explaining an operation of the voltage controller to control changing of a level of a verifying voltage according to the embodiment of FIG. 16.
Figure 17B:
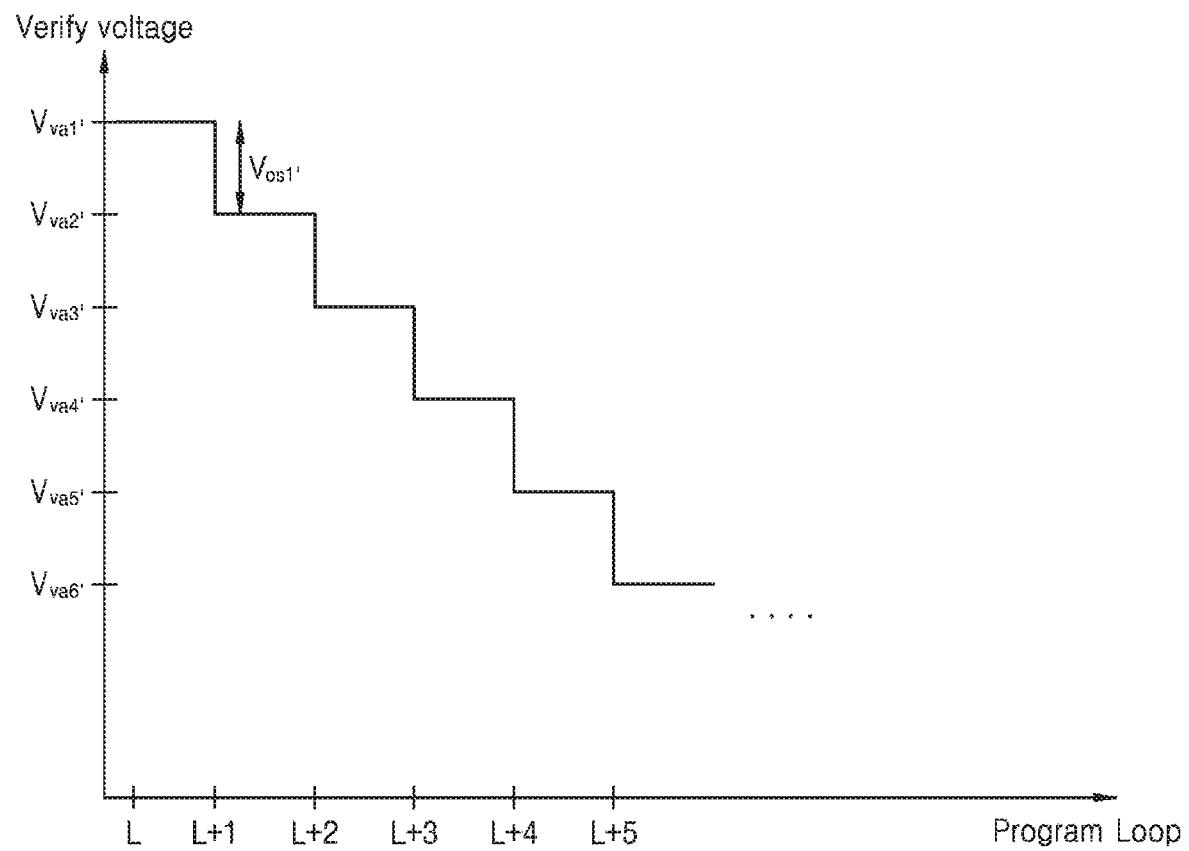

FIG. 16 illustrates a block diagram of a voltage controller 400 according to another embodiment of the inventive concept. FIGS. 17A and 17B each illustrate a graph for explaining an operation of the voltage controller 400 to control changing of a level of a verifying voltage according to the embodiment described with respect to FIG. 16.

Referring to FIGS. 16, 17A, and 17B, the voltage controller 400 includes a program loop counter 410, a verifying voltage level control signal generator 420, a control information storage unit 430, and a temperature information generator 440. As shown in FIG. 17A, the voltage controller 400 may set a level change degree of a predetermined verifying voltage under a first temperature condition to a first offset voltage $V_{os1}$ and may control a level of the predetermined verifying voltage to decrease from change start verify voltage $V_{va1}$ by a level of the first offset voltage $V_{os1}$ in every programming loop L+1 through L+5 to respectively provide verify voltages $V_{va2}$ to $V_{va6}$. In an embodiment as shown in FIG. 17B, the voltage controller 400 may set a level change degree of a predetermined verifying voltage under a second temperature condition to a first offset voltage $V_{os1'}$ and may control a level of the predetermined verifying voltage to decrease from change start verify voltage $V_{va1'}$ by a level of the first offset voltage $V_{os1'}$ in every programming loop L+1 through L+5 to respectively provide verify voltages $V_{va2'}$ to $V_{va6'}$.

The first temperature condition may have a temperature higher than a temperature of the second temperature condition, and the voltage controller 400 may control a level of a change start verify voltage $V_{va1}$ of the verifying voltage of FIG. 17A and the first offset voltage $V_{os1}$ to be respectively less than a level of a change start verify voltage $V_{va1'}$ of the verifying voltage of FIG. 17B and the first offset voltage $V_{os1'}$. Since a change amount of a threshold voltage of each of a fast cell and a slow cell per time increases as a temperature decreases as described with reference to FIGS. 8A and 8B, the voltage controller 400 may control changing of a verifying voltage by increasing a level of a change start verify voltage and a level change degree as a temperature of a temperature condition decreases.

A detailed method of the voltage controller 400 to control changing of a level of a verifying voltage will now be explained. The temperature information generator 440 may generate temperature information about a temperature inside or outside a memory device including the voltage controller 400. The temperature information may indicate a temperature inside or outside the memory device, and may be a predetermined coefficient that varies according to a temperature. Also, in an embodiment, the temperature information generator 440 may be a temperature sensor, and may be separately provided in the memory device, instead of being included in the voltage controller 400.

A voltage control signal CTRL_vol2 transmitted by the voltage controller 400 to the voltage generator 130 of FIG. 2 may include temperature information received from the temperature information generator 440 and a control signal generated by the verifying voltage level control signal generator 420. The temperature information may include a coefficient according to a temperature. For example, the coefficient according to the temperature may increase as the temperature decreases. The voltage generator 130 of FIG. 2 may generate verifying voltages whose levels are changed based on the voltage control signal CTRL_vol2. In an embodiment, the voltage generator 130 may perform a calculation on the coefficient according to the temperature and the control signal and may generate verifying voltages based on a calculation result.

Figure 18A:
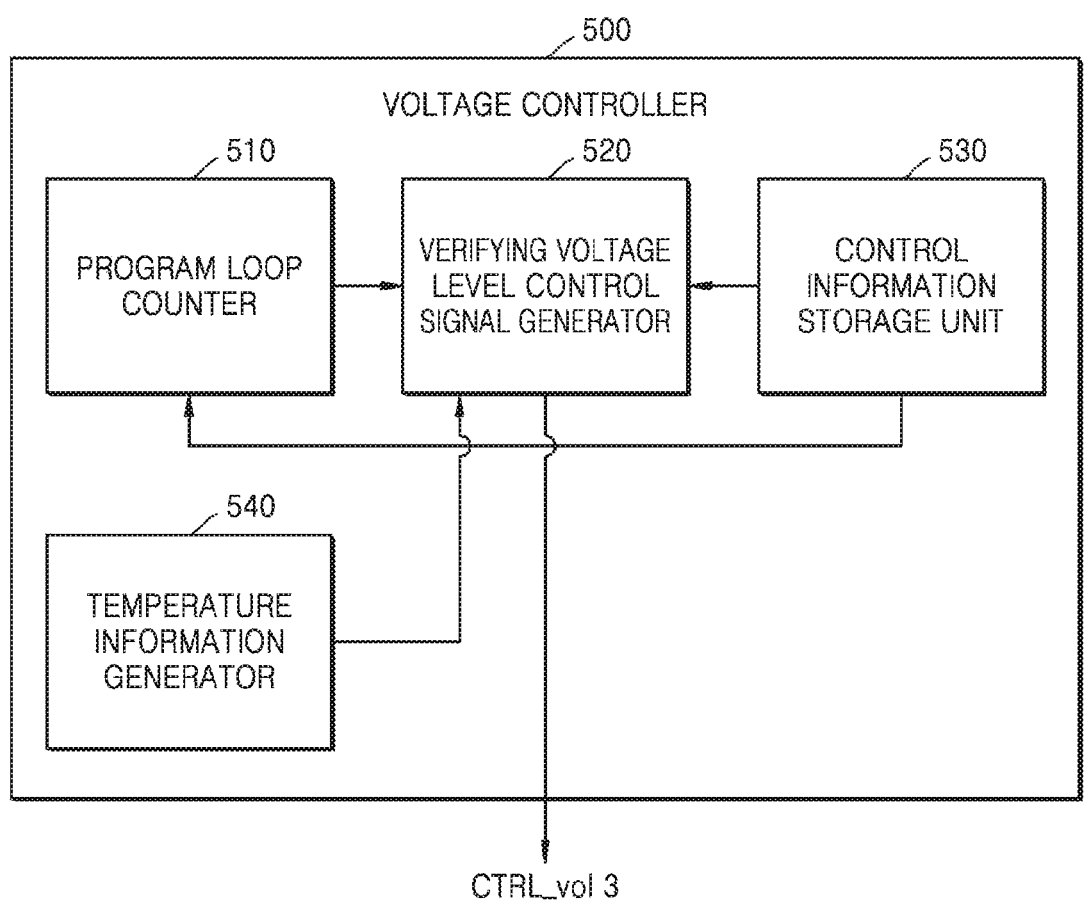
FIG. 18A illustrates a block diagram for explaining an operation of a voltage controller to control changing of a level of a verifying voltage according to another embodiment of the inventive concept.

FIG. 18A illustrates a block diagram for explaining an operation of a voltage controller 500 to control changing of a level of a verifying voltage according to another embodiment of the inventive concept. FIG. 18B is a diagram illustrating control information needed during an operation of the voltage controller 500 according to the embodiment described with respect to FIG. 18A.

Referring to FIG. 18A, the voltage controller 500 includes a program loop counter 510, a verifying voltage level control signal generator 520, a control information storage unit 530, and a temperature information generator 540. The verifying voltage level control signal generator 520 according to an embodiment may receive temperature information from the temperature information generator 540, and may receive control information from the control information storage unit 530. The verifying voltage level control signal generator 520 may generate a voltage control signal CTRL_vol3 based on the temperature information and the control information. Referring to FIG. 18B, control information including a change start verify voltage level parameter SVL and a level change degree parameter LCD that vary according to a temperature condition may be stored in the control information storage unit 530. Accordingly, the voltage controller 500 may change a level of a verifying voltage by referring to the change start verify voltage level parameter SVL and the level change degree parameter LCD corresponding to a temperature condition based on the temperature information. For example, it is assumed that a second temperature condition Temp.2 may have a temperature lower than a temperature of a first temperature condition Temp.1 and the voltage controller 500 changes a level of a first verifying voltage to verify the first programming state P1 of FIG. 6. The voltage controller 500 may control changing of the level of the first verifying voltage by making a level of a change start verify voltage $V_{va1'}$ under the second temperature condition Temp.2 greater than a level of a change start verify voltage $V_{va1}$ under the first temperature condition Temp.1 and making a level change degree $V_{os1'}$ under the second temperature condition Temp.2 greater than a level change degree $V_{os1}$ under the first temperature condition Temp.1. The voltage controller 500 may similarly change start verify voltage $V_{vb1}$ to change start verify voltage $V_{vb1'}$, change start verify voltage $V_{vc1}$ to change start verify voltage $V_{vc1'}$, level change degree $V_{os2}$ to level change degree $V_{os2'}$, and level change degree $V_{os3}$ to level change degree $V_{os3'}$ under the second temperature condition Temp. 2.

However, the inventive concept is not limited thereto, and control information may include the verifying voltage level parameter VVL that varies according to a temperature condition as shown in FIG. 11B, and the voltage controller 500 may control changing of a level of a verifying voltage based on the control information and temperature information.

Figure 19A:
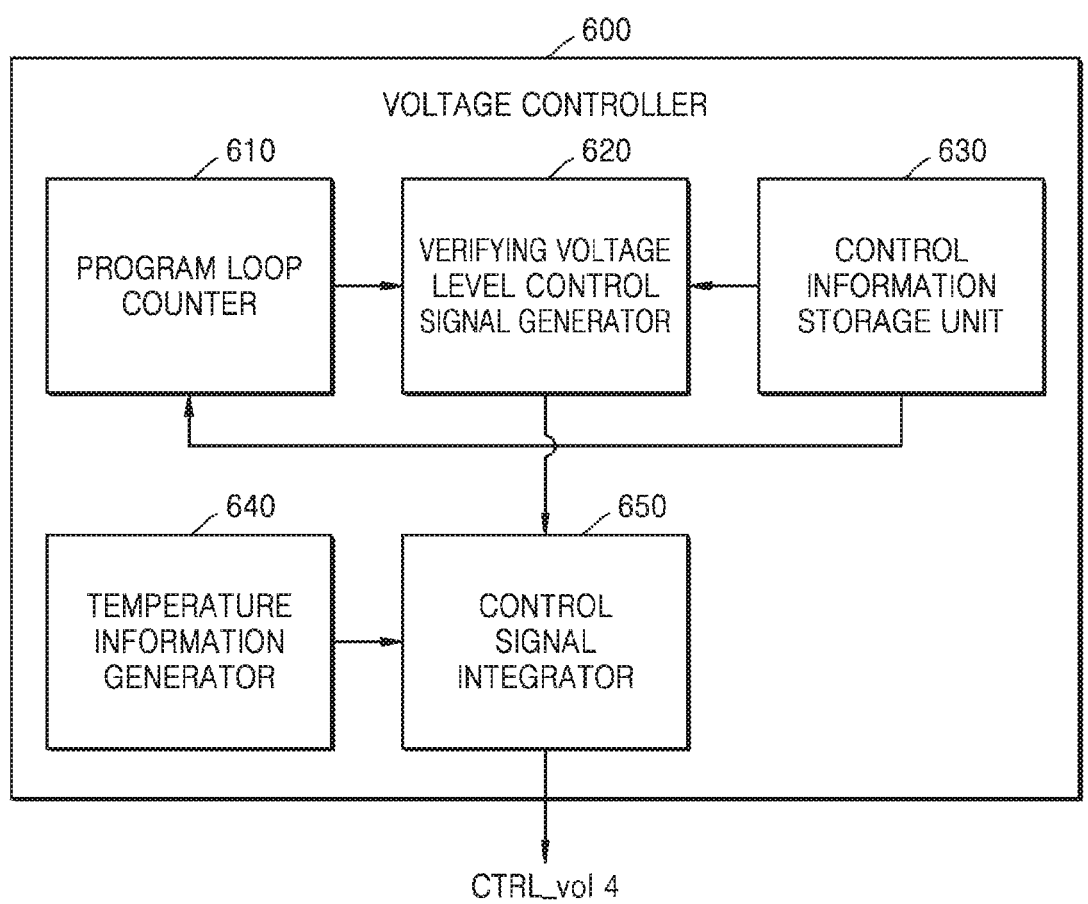
FIG. 19A illustrates a block diagram for explaining an operation of a voltage controller to control changing of a level of a verifying voltage according to another embodiment of the inventive concept.
Figure 19B:
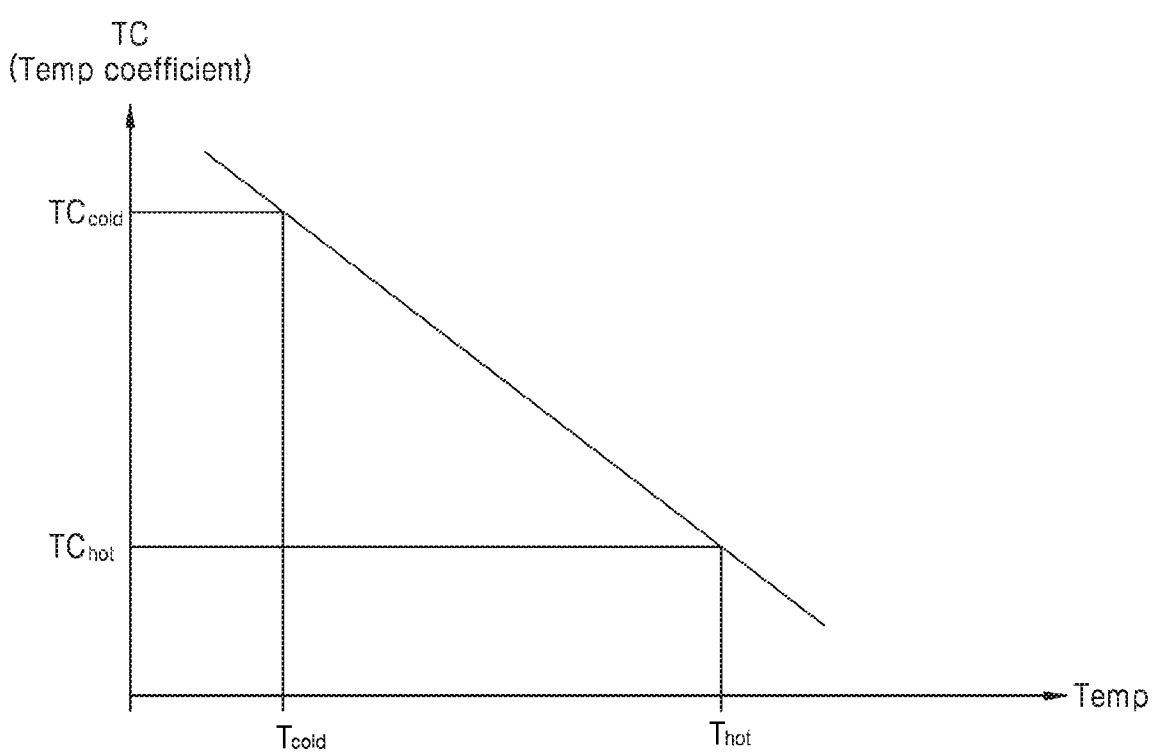
FIG. 19B illustrates a graph for explaining a method of a temperature information generator to generate temperature information according to the embodiment described with respect to FIG. 19A.

FIG. 19A illustrates a block diagram for explaining an operation of a voltage controller 600 to control changing of a level of a verifying voltage according to another embodiment of the inventive concept. FIG. 19B illustrates a graph for explaining a method of a temperature information generator 640 to generate temperature information according to the embodiment described with respect to FIG. 19A. In FIG. 19B, the vertical axis represents the temperature coefficient, and the horizontal axis represents temperature.

Referring to FIG. 19A, the voltage controller 600 includes a program loop counter 610, a verifying voltage level control signal generator 620, a control information storage unit 630, a temperature information generator 640, and a control signal integrator 650. Referring to FIG. 19B, by using a detected temperature inside or outside a memory device, the temperature information generator 640 may generate a coefficient according to the detected temperature. In an embodiment, the temperature information generator 640 may generate a first coefficient $TC_{hot}$ at a first temperature Thot that is high, and may generate a second coefficient $TC_{cold}$ at a second temperature Tcold that is low. The second coefficient $TC_{cold}$ may be greater than the first coefficient $TC_{hot}$. That is, the temperature information generator 640 may generate a coefficient that increases as a detected temperature decreases.

The control signal integrator 650 according to an embodiment may receive a voltage control signal from the verifying voltage level control signal generator 620, and may receive temperature information including the generated coefficient from the temperature information generator 640. The control signal integrator 650 may perform a predetermined calculation on the generated coefficient and the voltage control signal, to generate a voltage control integrated signal CTRL_vol3. For example, the control signal integrator 650 may generate the voltage control integrated signal CTRL_vol3 by multiplying the generated coefficient by the voltage control signal. The voltage controller 600 may control a level of a verifying voltage to be changed by varying at least one of a change start verify voltage level and a level change degree according to a temperature condition by using a generated coefficient, even without a parameter that varies according to a temperature condition included in control information of FIGS. 11A and 11B.

Figure 20A:
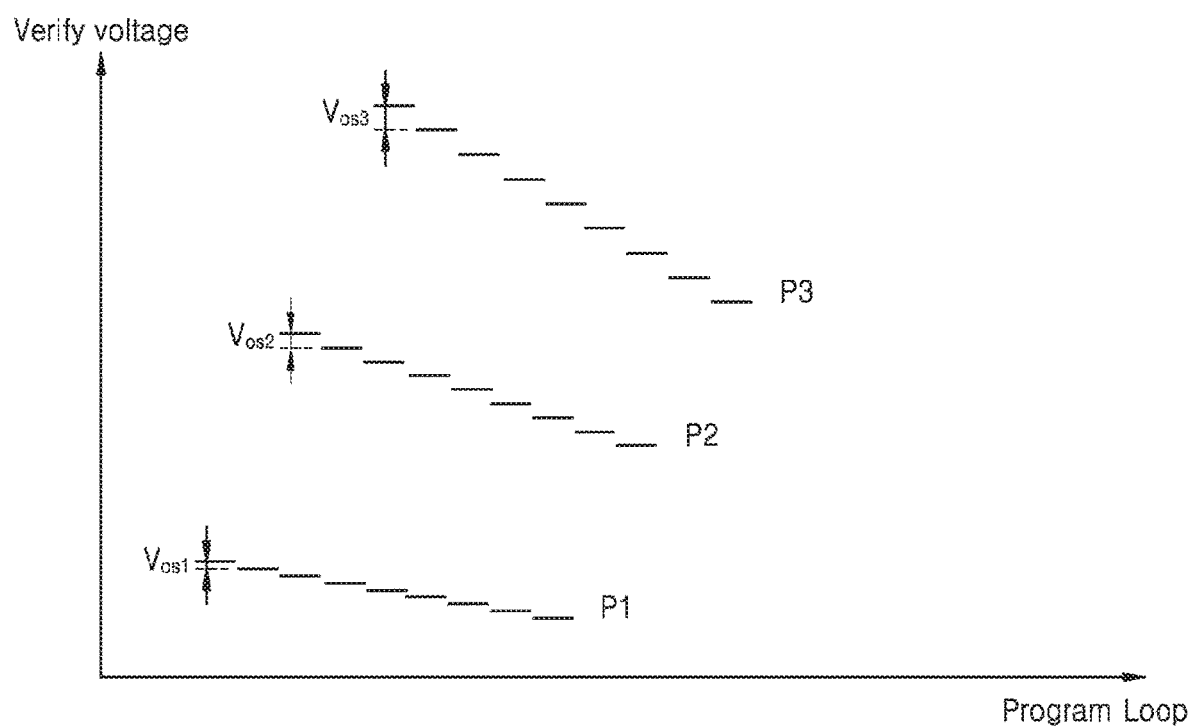
FIGS. 20A and 20B illustrate graphs for explaining an overall operation of a voltage controller according to an embodiment of the inventive concept.
Figure 20B:
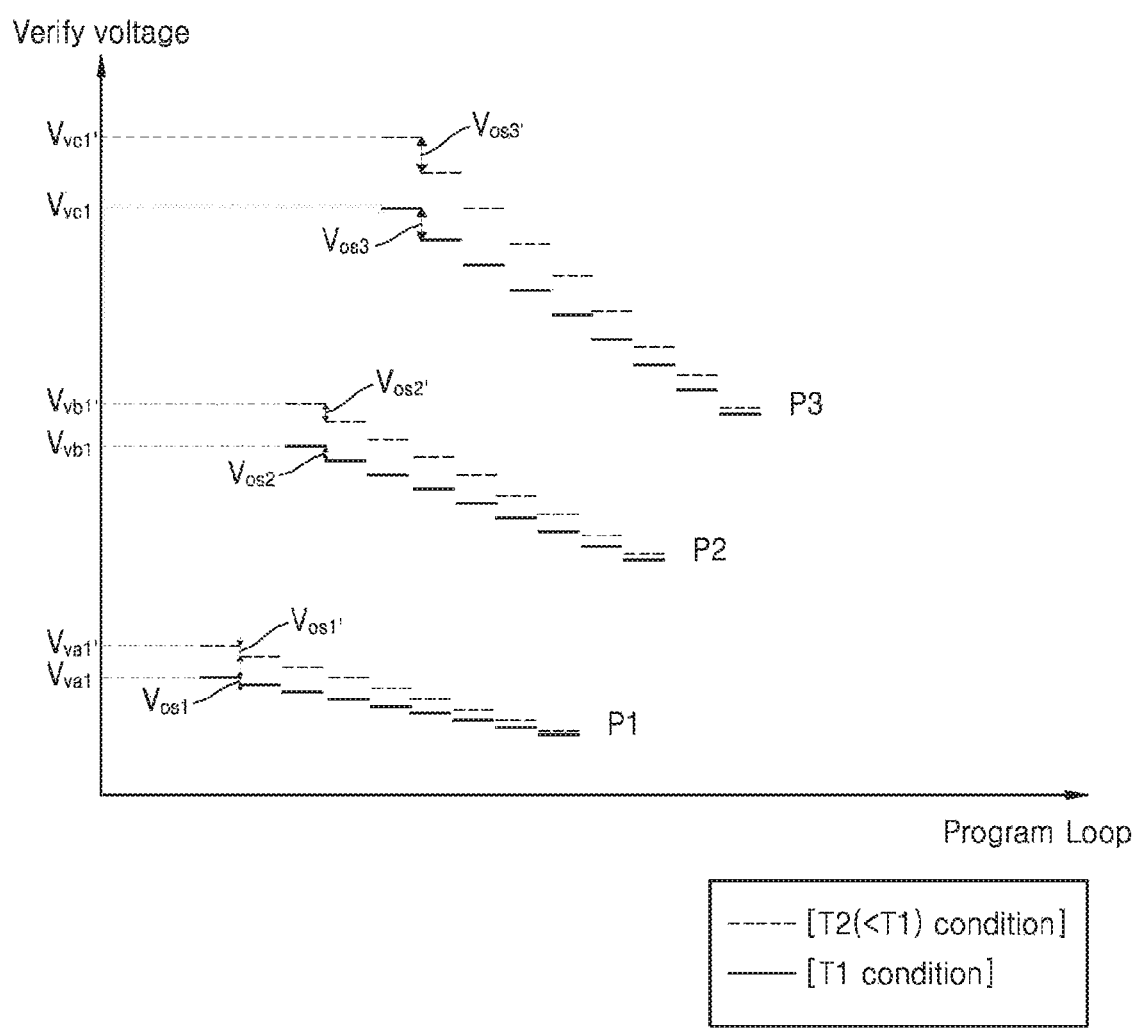

FIGS. 20A and 20B are graphs for explaining an overall operation of the voltage controller 121 shown in FIG. 2 according to an embodiment of the inventive concept.

Referring to FIGS. 2 and 20A, the voltage controller 121 may control changing of a level of each of verifying voltages based on at least one of a programming state of memory cells to be verified and temperature information about a temperature inside or outside the memory device 100. In an embodiment, the voltage controller 121 may control changing of a level of each verifying voltage according to a programming state of memory cells to be verified. That is, the voltage controller 121 may control changing of a level of each verifying voltage by increasing a change start verify voltage level and a level change degree of the verifying voltage as a level of the verifying voltage corresponding to a programming state to be verified increases. For example, as shown in FIG. 20A the voltage controller 121 may control changing of a level of each verifying voltage by making a change start verify voltage level and a level change degree $V_{os2}$ of a second verifying voltage for verifying a second programming state P2 greater than a change start verify voltage level and a level change degree $V_{os1}$ of a first verifying voltage for verifying a first programming state P1. Also, the voltage controller 121 may control changing of a level of each verifying voltage by making a change start verify voltage level and a level change degree $V_{os3}$ of a third verifying voltage for verifying a third programming state P3 greater than the change start verify voltage level and the level change degree $V_{os2}$ of the second verifying voltage for verifying the second programming state P2. In another embodiment, the voltage controller 112 may control verifying voltages to have different level change start timings by differently setting level change start loops of the first verifying voltage through the third verifying voltage.

Moreover, as shown in FIG. 20B, the voltage controller 121 may control changing of a level of each verifying voltage according to temperature information about a temperature inside or outside the memory device 100 and a programming state of memory cells to be verified. For example, the voltage controller 121 may control changing of a level of a third verifying voltage by making a level of a change start verify voltage $V_{vc1'}$ and a level change degree $V_{os3'}$ of a third verifying voltage for verifying a third programming state P3 under a second temperature condition T2 condition greater than a level of a change start verify voltage $V_{vc1}$ and a level change degree $V_{os3}$ of a third verifying voltage for verifying the third programming state P3 under a first temperature condition T1 condition. Similarly, the voltage generator 121 may make a level of a change start verify voltage $V_{vb1'}$ and a level change degree $V_{os2'}$ of a second verifying voltage for verifying a second programming state P2 under a second temperature condition T2 condition greater than a level of a change start verify voltage $V_{vb1}$ and a level change degree $V_{os2}$ of a second verifying voltage for verifying the second programming state P2 under a first temperature condition T1 condition. Likewise, for verifying the first programming state P1, the voltage generator 121 may make a level of a change start verify voltage $V_{va1'}$ and a level change degree $V_{os1'}$ under a second temperature condition T2 condition greater than a level of a change start verify voltage $V_{va1}$ and a level change degree $V_{os1}$ under a first temperature condition T1 condition.

The voltage controller 121 according to an embodiment may control changing of a level of each verifying voltage based on at least one of a programming state to be verified and temperature information about a temperature inside or outside the memory device 100, in order to perform a verifying operation considering that a threshold voltage of a memory cell is shifted.

Figure 21:
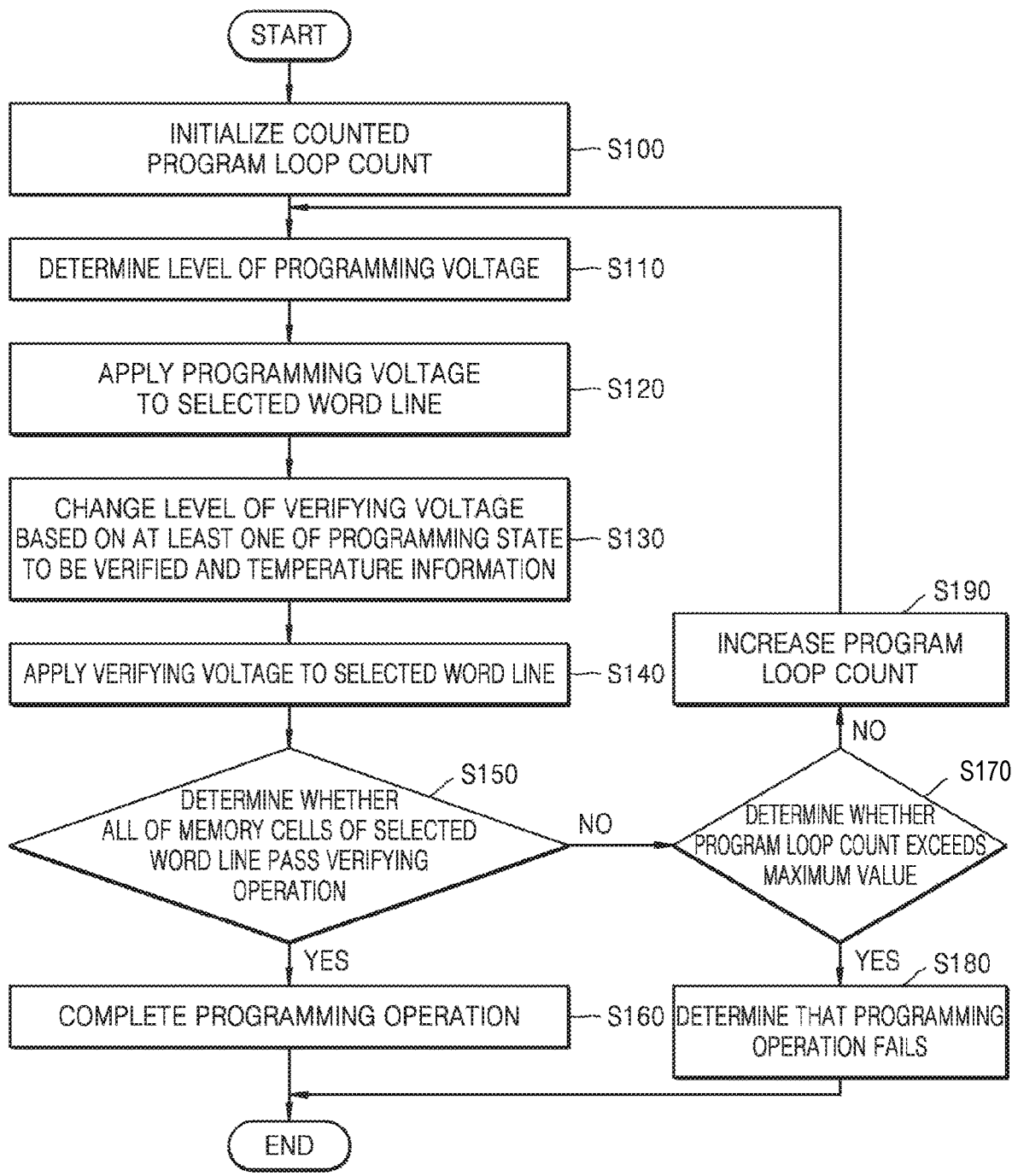
FIG. 21 illustrates a flowchart for explaining a programming operation performed in a memory device according to an embodiment of the inventive concept.

FIG. 21 illustrates a flowchart for explaining a programming operation in a memory device such as memory device 100 shown in FIG. 2 for example, according to an embodiment of the inventive concept. In the description that follows, it is assumed that memory device 100 includes voltage controller 200 shown in FIG. 10 for example. However, in other embodiments memory device 100 may include any of the voltage controllers of the various embodiments previously described.

Referring to FIG. 21, FIG. 2 and FIG. 10 for example, in operation S100 a program loop counter such as program loop counter 210 initializes a program loop count before a programming operation starts. In operation S110, a level of a programming voltage to be applied to memory cells of the memory cell array 110 connected to a selected word line is determined. The level of the programming voltage may be determined by control logic 120 to correspond to a pulse voltage that increases by a predetermined step voltage by using the program loop count. In operation S120, the determined programming voltage as provided by voltage generator 130 is applied to the selected word line via row decoder 140 for example. Next, in order to verify the memory cells connected to the selected word line, a level of a verifying voltage is determined by voltage controller 200 for example. In an embodiment, in operation S130 the level of the verifying voltage may be changed based on at least one of a programming state to be verified and temperature information. In operation S140, a verifying operation is performed by applying the verifying voltage whose level has been changed as provided by voltage generator 130 to the selected word line via row decoder 140. In operation S150, it is determined by control logic 120 for example whether all of the memory cells of the selected word line pass the verifying operation. When it is determined in operation S150 that all of the memory cells pass the verifying operation, processing proceeds to operation S160 where it is determined that the programming operation is completed. When it is determined in operation S150 that all of the memory cells do not pass the verifying operation, processing proceeds to operation S170 where it is determined by control logic 120 whether the counted program loop count exceeds a maximum value. When it is determined in operation S170 that the counted program loop count exceeds the maximum value, processing proceeds to operation S180 where it is determined that the programming operation fails. When it is determined in operation S170 that the counted program loop count does not exceed the maximum value, processing proceeds to operation S190 where the program loop count is increased, and a next programming loop is executed thereafter beginning at operation S110.

Figure 22:
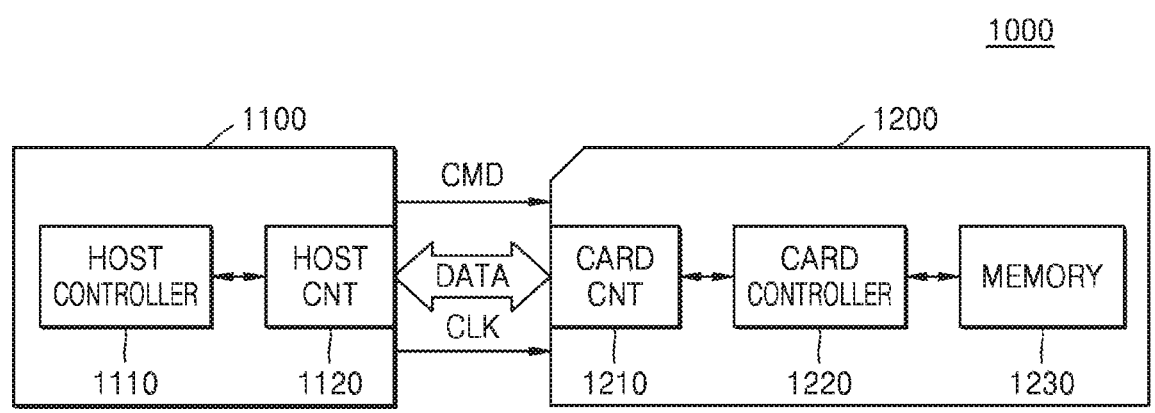
FIG. 22 illustrates a block diagram of an example of applying a memory device to a memory card system according to embodiments of the inventive concept.

FIG. 22 illustrates a block diagram of an example where a memory device is applied to a memory card system 1000 according to embodiments of the inventive concept.

Referring to FIG. 22, the memory card system 1000 includes a host 1100 and a memory card 1200. The host 1100 includes a host controller 1110 and a host connector 1120. The memory card 1200 includes a card connector 1210, a card controller 1220, and a memory device 1230. In this case, the memory card 1200 may be realized by using the embodiment of FIG. 1, or any of the other variously disclosed embodiments.

The host 1100 may write data to the memory card 1200 or may read data stored in the memory card 1200. The host controller 1110 may transmit a command CMD, a clock signal CLK generated by a clock generator (not shown) in the host 1100, and data DATA to the memory card 1200 through the host connector 1120.

The card controller 1220 may synchronize data with a clock signal generated by a clock signal (not shown) in the card controller 1220 and may store the data in the memory device 1230, in response to a command received through the card connector 1210. The memory device 1230 may store the data transmitted from the host 1100.

The memory card 1200 may be for example any of a compact flash card (CFC), a microdrive, a smart media card (SMC), a multimedia card (MMC), a security digital card (SDC), a memory stick, and a USB flash memory driver or the like.

Figure 23:
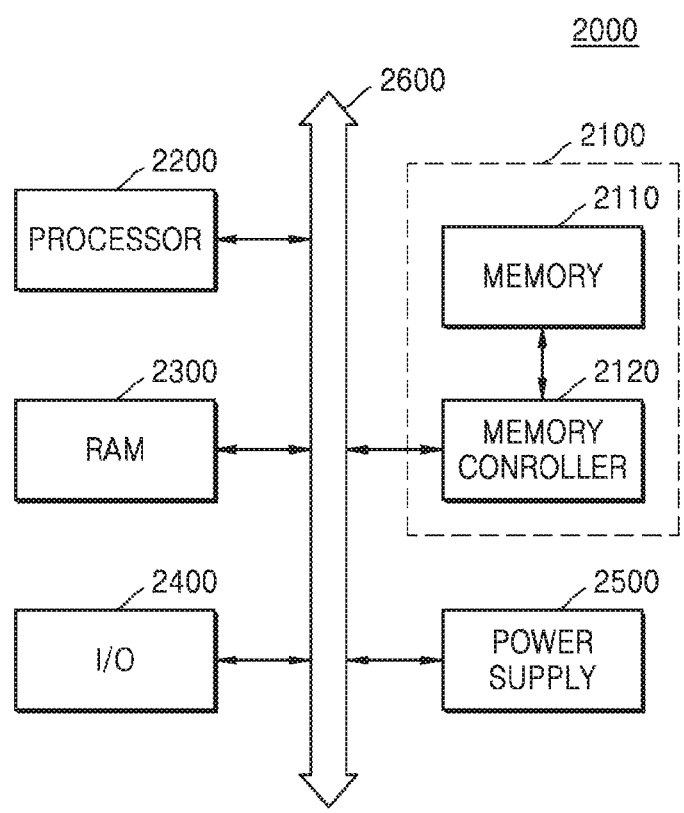
FIG. 23 illustrates a block diagram of a computing system including a memory device according to embodiments of the inventive concept.

FIG. 23 illustrates a block diagram of a computing system 2000 including a memory device according to embodiments of the inventive concept.

Referring to FIG. 23, the computing system 2000 includes a memory system 2100, a processor 2200, a RAM 2300, an input/output device 2400, and a power supply 2500. The computing system 2000 may communicate with a video card, a sound card, a memory card, or a USB device or the like for example, or may further include ports for communicating with other electronic devices. The computing system 2000 may be for example a personal computer, or may be a portable electronic device such as a notebook computer, a mobile phone, a personal digital assistant (PDA), or a camera, or the like.

The processor 2200 may perform specific calculations or tasks. According to an embodiment, the processor 2200 may be a microprocessor or a central processing unit (CPU). The processor 2200 may communicate with the RAM 2300, the input/output device 2400, and the memory system 2100 through a bus 2600 such as an address bus, a control bus, or a data bus. According to an embodiment, the processor 2200 may be connected to an expansion bus such as a peripheral component interconnect (PCI) bus.

In this case, the memory system 2100 may be realized by using the embodiment of FIG. 1, or any of the other variously disclosed embodiments. In detail, a memory device 2110 may perform a verifying operation by changing a level of a verifying voltage based on at least one of a programming state of memory cells to be verified and temperature condition about a temperature inside or outside the memory device 2110.

The RAM 2300 may store data needed during an operation of the computing system 2000. For example, the RAM 2300 may be for example a dynamic random-access memory (DRAM), a mobile DRAM, a static RAM (SRAM), a phase-change RAM (PRAM), a ferroelectric RAM (FRAM), a resistive RAM (RRAM), and/or a magnetoresistive RAM (MRAM). The input/output device 2400 may include an input device such as for example a keyboard, a keypad, or a mouse, or the like, and an output device such as a printer or a display. The power supply 2500 may supply an operating voltage needed during an operation of the computing system 2000.

Figure 24:
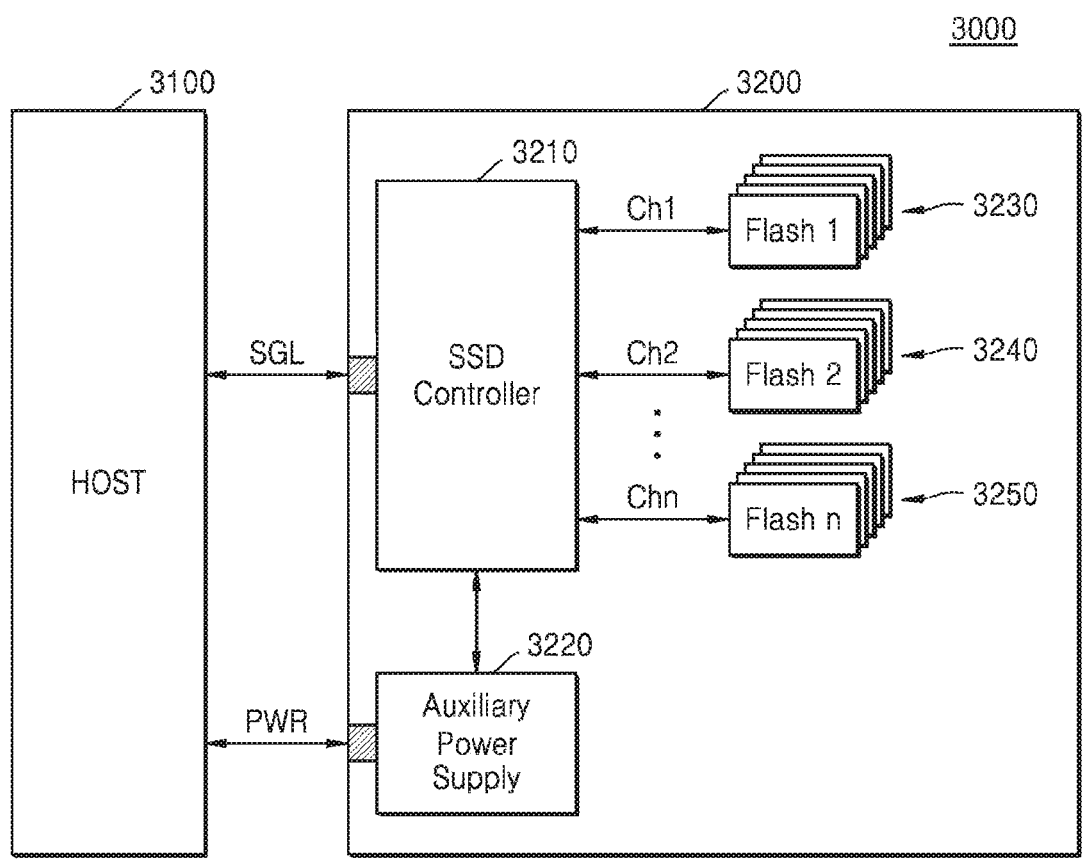
FIG. 24 illustrates a block diagram of an example of applying a memory device to a solid-state disk (SSD) system according to embodiments of the inventive concept.

FIG. 24 illustrates a block diagram of an example where a memory device is applied to a solid-state disk (SSD) system 3000 according to embodiments of the inventive concept.

Referring to FIG. 24, the SSD system 3000 includes a host 3100 and an SSD 3200. The SSD 3200 transmits/receives a signal SGL to/from the host 3100 through a signal connector, and receives power PWR through a power connector. The SSD 3200 includes a SSD controller 3210, an auxiliary power supply 3220, and a plurality of memory devices 3230, 3240, and 3250 connected to SSD controller 3210 via channels Ch1, Ch2, . . . Chn. In this case, the SSD 3200 may be realized by using the embodiment of FIG. 1, or any of the other variously disclosed embodiments. In detail, the SSD 3200 may perform a verifying operation by changing a level of a verifying voltage based on at least one of a programming state of memory cells to be verified and temperature information about a temperature inside or outside the SSD 3200.

Figure 25:
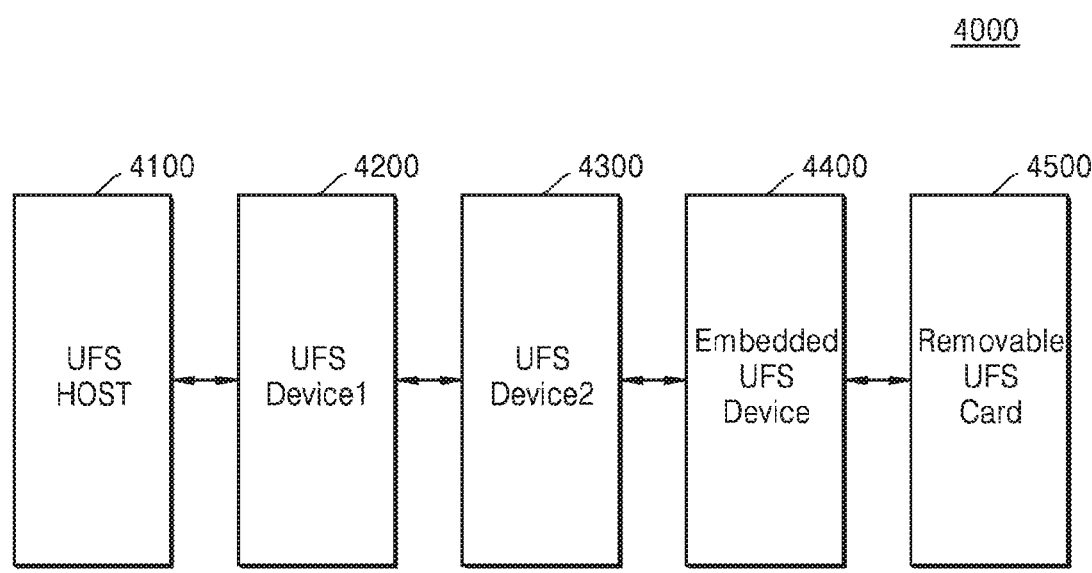
FIG. 25 illustrates a block diagram of an example of applying a memory device to a universal flash storage (UFS) system according to embodiments of the inventive concept.

FIG. 25 illustrates a block diagram of an example where a memory device is applied to a universal flash storage (UFS) system 4000 according to embodiments of the inventive concept.

Referring to FIG. 25, the UFS system 4000 includes a UFS host 4100, UFS device1 4200, UFS device2 4300, an embedded UFS device 4400, and a removable UFS card 4500. The UFS host 4100 may for example be an application processor of a mobile device. Each of the UFS host 4100, the UFS devices 4200 and 4300, the embedded UFS device 4400, and the removable UFS card 4500 may communicate with external devices through a UFS protocol. At least one of the UFS devices 4200 and 4300, the embedded UFS device 4400, and the removable UFS card 4500 may include the memory device 100 of FIG. 1.

The embedded UFS device 4400 and the removable UFS card 4500 may communicate with each other through a protocol other than the UFS protocol. The UFS host 4100 and the removable UFS card 4500 may communicate through various card protocols such as for example USB flash drive (UFD), MMC, secure digital (SD), miniSD, and microSD.

A memory card, a nonvolatile memory device, and a card controller according to the inventive concept may be mounted by using any of various packages. For example, a flash memory device and/or a memory controller according to the inventive concept may be mounted by using any of packages such as package on package (PoP), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), system in package (SIP), multi chip package (MCP), wafer-level fabricated package (WFP), and wafer-level processed stack package (WSP).

While the inventive concept has been particularly shown and described with reference to embodiments thereof, it will be understood that various changes in form and details may be made therein without departing from the spirit and scope of the following claims. Accordingly, the technical scope of the inventive concept should be defined by the accompanying claims.

What is claimed is:

1. A memory device comprising:
   a memory cell array comprising a plurality of memory cells on which a programming loop is executed a plurality of times;
   a voltage generator configured to apply a verifying voltage to each of the memory cells, for verifying at least one programming state of the memory cells; and
   a voltage controller configured to control the voltage generator to change a level of the verifying voltage as a program loop count increases, based on temperature information about a temperature inside or outside the memory device,
   wherein the voltage controller is further configured to control the voltage generator so that the level of the verifying voltage in a current program loop is lower than the level of the verifying voltage in a previous program loop.

2. The memory device of claim 1, wherein the voltage controller is further configured to control the voltage generator to generate the verifying voltage according to at least one of a level change degree and a change start verify voltage level selected based on the temperature information.

3. The memory device of claim 2, wherein the voltage controller is further configured to control the voltage generator so that the level change degree of the verifying voltage increases as the temperature decreases.

4. The memory device of claim 2, wherein the voltage controller is further configured to control the voltage generator so that the change start verify voltage level of the verifying voltage increases as the temperature decreases.

5. The memory device of claim 1, wherein the voltage controller is further configured to control the voltage generator so that the level of the verifying voltage increases as the temperature decreases.

6. The memory device of claim 1, wherein the voltage controller is further configured to control the voltage generator to generate the verifying voltage according to at least one of a level change degree and a change start verify voltage level selected based on programming states of the memory cells to be verified.

7. The memory device of claim 1, wherein the voltage controller is further configured to control the voltage generator so that the verifying voltage reaches a level less than a reference voltage level corresponding to the verifying voltage.

8. The memory device of claim 1, wherein the voltage controller is further configured to control the voltage generator to fix the level of the verifying voltage after the programming loop is executed on the memory cells a predetermined number of times.

9. The memory device of claim 1, wherein the memory cells are vertically stacked on a substrate of the memory device.

10. A memory device comprising:
    a memory cell array comprising a plurality of memory cells on which a programming loop is executed a plurality of times;
    a voltage generator configured to apply verifying voltages to the memory cell array, for verifying programming states of the memory cells; and
    a voltage controller configured to control the voltage generator so that levels of the verifying voltages gradually decrease as a program loop count increases.

11. The memory device of claim 10, wherein the voltage controller is configured to control a verifying operation to be performed by applying a first verifying voltage from among the verifying voltages that has a first level to predetermined memory cells from among the memory cells in order to verify whether the predetermined memory cells are in a predetermined programming state, and by applying a second verifying voltage from among the verifying voltages that has a second level, which is less than the first level, to memory cells from among the predetermined memory cells that fail to pass the verifying operation performed by applying the first verifying voltage in order to verify whether the failed memory cells are in the predetermined programming state.

12. The memory device of claim 10, wherein the voltage controller is further configured to control the voltage generator so that the verifying voltages for verifying the programming states have different level change start timings.

13. The memory device of claim 12, further comprising a program loop counter configured to count the program loop count,
    wherein the voltage controller is further configured to control the verifying voltages to have the different level change start timings based on the counted program loop count.

14. The memory device of claim 13, wherein the voltage controller comprises a plurality of verifying voltage level control signal generators configured to control changing of the levels of the verifying voltages,
    wherein the program loop counter is configured to control the verifying voltage level control signal generators to be activated/deactivated based on the counted program loop count so that the verifying voltages have the different level change start timings.

15. The memory device of claim 10, wherein the voltage controller is configured to control the voltage generator so that the verifying voltages have different level change degrees based on the programming states of the memory cells to be verified.

16. The memory device of claim 15, wherein the voltage controller is configured to control the voltage generator so that the level change degrees increase as the levels of the verifying voltages corresponding to the programming states to be verified increase.

17. The memory device of claim 15, wherein the voltage controller is configured to control a first level difference between a change start verify voltage level of a first verifying voltage for verifying a first programming state and a change start verify voltage level of a second verifying voltage for verifying a second programming state to be different from a second level difference between the change start verify voltage level of the second verifying voltage for verifying the second programming state and a change start verify voltage level of a third verifying voltage for verifying a third programming state.

18. The memory device of claim 17, wherein a threshold voltage level of the third programming state is greater than a threshold voltage level of the second programming state, and the threshold voltage level of the second programming state is greater than a threshold voltage level of the first programming state,
    wherein the second level difference is greater than the first level difference.

19. The memory device of claim 10, further comprising a temperature information generator configured to generate temperature information about a temperature inside or outside the memory device,
    wherein the voltage controller is further configured to control the voltage generator to change the levels of the verifying voltages based on the temperature information.

20. The memory device of claim 19, wherein the voltage controller is further configured to control the voltage generator so that the levels of the verifying voltages increase as the temperature decreases.

21. The memory device of claim 19, wherein the voltage generator is controlled to generate the verifying voltages with different level change degrees based on the temperature information.

22. The memory device of claim 10, wherein the voltage controller is further configured to control the voltage generator based on control information comprising at least one of a change start verify voltage level parameter, a level change degree parameter, and a level change start loop parameter.

23. The memory device of claim 22, wherein the control information comprises at least one of the change start verify voltage level parameter, the level change degree parameter, and the level change start loop parameter that vary according to each of the program states of the memory cells to be verified.

24. A memory system comprising:
    a memory device comprising memory cells on which a programming loop is executed a plurality of times; and
    a memory controller configured to control the programming loop executed on the memory device,
    wherein the memory device comprises
        a voltage controller configured to control generation of verifying voltages having levels that are gradually decreased as a program loop count increases based on temperature information about a temperature inside or outside the memory device and programming states of the memory cells to be verified.

25. The memory system of claim 24, wherein the voltage controller is further configured to control generation of the verifying voltages according to at least one of a level change degree and a change start verify voltage level.

* * * * *